US006485659B1

(12) United States Patent
Goedde et al.

(10) Patent No.: US 6,485,659 B1
(45) **Date of Patent: *Nov. 26, 2002**

(54) ELECTRICAL APPARATUS WITH DIELECTRIC FLUID BLEND OF POLYALPHAOLEFINS AND POLYOL ESTERS OR TRIGLYCERIDES

(75) Inventors: Gary L. Goedde, Racine, WI (US); Gary A. Gauger, Franklin, WI (US); John Lapp, Franklin, WI (US); Alan Paul Yerges, Muskego, WI (US)

(73) Assignee: Cooper Industries, Inc., Houston, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/097,624

(22) Filed: Jun. 16, 1998

Related U.S. Application Data

(63) Continuation of application No. 08/576,229, filed on Dec. 21, 1995, now Pat. No. 5,766,517.

(51) Int. Cl.[7] .......................... H01B 3/24; H01B 3/20; H05K 5/00

(52) U.S. Cl. ...................... 252/570; 252/579; 508/485; 508/486; 508/490; 508/491; 174/17 LF; 336/94

(58) Field of Search ............................... 252/579, 570; 508/485, 486, 490, 491; 174/17 LF; 336/94

(56) References Cited

U.S. PATENT DOCUMENTS 2,288,341 A 6/1942 Addink et al. ............. 175/366

(List continued on next page.)

*Primary Examiner*—Yogendra N. Gupta
*Assistant Examiner*—D G H
(74) *Attorney, Agent, or Firm*—Fish & Richardson P.C.

(57) ABSTRACT

The present invention comprises a mixture of hydrocarbons having a well-defined chemical composition that is suitable for use as a dielectric coolant in electrical equipment in general, and specifically in transformers. The dielectric coolants of the present invention are particularly suited for use in sealed, non-vented transformers, and have improved performance characteristics, including decreased degradation of the paper insulating layers, as well as a greater degree of safety and environmental acceptability. The present dielectric coolants comprise relatively pure blends of compounds selected from the group consisting of aromatic hydrocarbons, polyalphaolefins, polyol esters, and natural vegetable oils, along with additives to improve pour point, increase stability and reduce oxidation rate.

30 Claims, 6 Drawing Sheets

U.S. PATENT DOCUMENTS

| | | | | | |
|---|---|---|---|---|---|
| 2,440,930 | A | | 5/1948 | Camilli et al. | 62/115 |
| 2,825,651 | A | | 3/1958 | Ching Loo et al. | 99/171 |
| 3,073,885 | A | | 1/1963 | Camilli | 174/15 |
| 3,233,198 | A | | 2/1966 | Schrader et al. | 336/94 |
| 3,626,080 | A | | 12/1971 | Pierce | 174/15 R |
| 3,902,146 | A | | 8/1975 | Muralidharan | 336/57 |
| 4,019,996 | A | | 4/1977 | Jay et al. | 252/63.7 |
| 4,053,941 | A | | 10/1977 | Shimizu et al. | 361/319 |
| 4,085,395 | A | | 4/1978 | Billerbeck et al. | 336/61 |
| 4,108,789 | A | | 8/1978 | Jay et al. | 252/64 |
| 4,142,983 | A | | 3/1979 | Jay et al. | 252/64 |
| 4,175,046 | A | * | 11/1979 | Coant et al. | 585/3 |
| 4,187,327 | A | | 2/1980 | Lapp et al. | 427/8 |
| 4,211,665 | A | | 7/1980 | Pellegrini | 252/63 |
| 4,238,343 | A | | 12/1980 | Pellegrini | 585/24 |
| 4,256,591 | A | | 3/1981 | Yamamoto et al. | 252/12 |
| 4,259,708 | A | | 3/1981 | Mandelcorn | 361/318 |
| 4,266,264 | A | | 5/1981 | Mandelcorn et al. | 361/318 |
| 4,276,184 | A | | 6/1981 | Mandelcorn et al. | 252/579 |
| 4,290,926 | A | | 9/1981 | Shaw | 252/579 |
| 4,294,715 | A | | 10/1981 | Klein et al. | 361/318 |
| 4,320,034 | A | | 3/1982 | Lapp et al. | 252/567 |
| 4,343,029 | A | | 8/1982 | Renga et al. | 361/315 |
| 4,347,169 | A | | 8/1982 | Sato et al. | 252/567 |
| 4,355,346 | A | | 10/1982 | Gauger et al. | 361/318 |
| 4,384,972 | A | | 5/1983 | Nakamura et al. | 252/188.21 |
| 4,413,674 | A | | 11/1983 | Avery et al. | 165/104.33 |
| 4,427,561 | A | | 1/1984 | Kusayanagi et al. | 252/45 |
| 4,467,305 | A | | 8/1984 | Ando | 336/55 |
| 4,493,943 | A | | 1/1985 | Sato et al. | 174/25 C |
| 4,511,949 | A | | 4/1985 | Shedigian | 361/319 |
| 4,530,782 | A | | 7/1985 | Meyer | 252/578 |
| 4,543,207 | A | | 9/1985 | Sato et al. | 252/570 |
| 4,549,034 | A | | 10/1985 | Sato et al. | 17/17 LF |
| 4,566,994 | A | | 1/1986 | Hasegawa et al. | 252/574 |
| 4,570,043 | A | | 2/1986 | Lloyd et al. | 200/150 |
| 4,618,914 | A | | 10/1986 | Sato et al. | 361/315 |
| 4,621,980 | A | | 11/1986 | Reavely et al. | 416/226 |
| 4,623,953 | A | | 11/1986 | Dakin | 361/315 |
| 4,681,302 | A | | 7/1987 | Thompson | 256/13.1 |
| 4,697,043 | A | | 9/1987 | Rowe, Jr. | 174/17 LF |
| 4,734,824 | A | | 3/1988 | Sato et al. | 361/315 |
| 4,738,780 | A | | 4/1988 | Atwood | 210/634 |
| 4,744,000 | A | | 5/1988 | Mason et al. | 361/315 |
| 4,744,905 | A | | 5/1988 | Atwood | 210/634 |
| 4,745,966 | A | | 5/1988 | Avery | 165/104.33 |
| 4,747,447 | A | | 5/1988 | Scanian et al. | 165/104.34 |
| 4,806,276 | A | | 2/1989 | Maier | 252/570 |
| 4,812,262 | A | * | 3/1989 | Shinzawa et al. | 252/579 |
| 4,828,703 | A | | 5/1989 | Atwood | 210/634 |
| 4,834,257 | A | | 5/1989 | Book et al. | 220/85 |
| 4,846,163 | A | | 7/1989 | Bannister et al. | 128/124 |
| 4,929,784 | A | | 5/1990 | Klinkmann et al. | 585/422 |
| 4,956,122 | A | * | 9/1990 | Watts et al. | 585/11 |
| 4,990,718 | A | | 2/1991 | Pelrine | 585/455 |
| 5,136,116 | A | | 8/1992 | Ohhazama et al. | 585/6.6 |
| 5,151,205 | A | * | 9/1992 | Culpon, Jr. | 252/56 R |
| 5,159,527 | A | | 10/1992 | Flynn | 361/317 |
| 5,171,918 | A | | 12/1992 | Shubkin et al. | 585/510 |
| 5,250,750 | A | | 10/1993 | Shubkin et al. | 174/17 LF |
| 5,259,978 | A | | 11/1993 | Yoshimura et al. | 252/79 |
| 5,451,334 | A | | 9/1995 | Bongardt et al. | 252/56 R |
| 5,458,795 | A | * | 10/1995 | Lawate | 252/56 R |
| 5,545,355 | A | | 8/1996 | Commandeur et al. | 252/570 |
| 5,554,311 | A | * | 9/1996 | Katafuchi et al. | 252/68 |
| 5,646,099 | A | * | 7/1997 | Watts et al. | 508/232 |
| 5,658,864 | A | * | 8/1997 | Macpherson | 508/491 |
| 5,736,915 | A | * | 4/1998 | Goedde et al. | 336/55 |
| 5,778,863 | A | * | 7/1998 | Oosuka et al. | 123/634 |
| 5,858,935 | A | * | 1/1999 | Watts et al. | 508/591 |
| 5,912,215 | A | * | 6/1999 | Sapienza et al. | 508/584 |
| 5,949,017 | A | * | 9/1999 | Oomen et al. | 174/17 LF |

* cited by examiner

ELECTRICAL APPARATUS WITH DIELECTRIC FLUID BLEND OF POLYALPHAOLEFINS AND POLYOL ESTERS OR TRIGLYCERIDES

CROSS-REFERENCE TO RELATED APPLICATIONS

The present application is a continuation of co-pending U.S. application Ser. No. 08/576,229, filed on Dec. 21, 1995 now U.S. Pat. No. 5,766,517.

STATEMENT REGARDING FEDERALLY SPONSORED RESEARCH OR DEVELOPMENT

Not applicable.

TECHNICAL FIELD OF THE INVENTION

This invention relates generally to equipment utilized in the transmission and distribution of electrical power. More specifically, the invention relates to transformers and other apparatus containing dielectric fluids, particularly dielectric fluids comprising relatively pure blends of compounds selected from the group consisting of aromatic hydrocarbons, polyalphaolefins, polyol esters, and natural vegetable oils. The invention further relates to the methods for preparing and processing such fluids and filling and sealing electrical apparatus with such fluids.

BACKGROUND OF THE INVENTION

Many types of conventional electrical equipment contain a dielectric fluid for dissipating the heat that is generated by energized components, and for insulating those components from the equipment enclosure and from other internal parts and devices. Examples of such equipment include transformers, capacitors, switches, regulators, circuit breakers and reclosers. A transformer is a device that transfers electric power from one circuit to another by electrical magnetic means. Transformers are used extensively in the transmission of electrical power, both at the generating end and the user's end of the power distribution system. A distribution transformer is one that receives electrical power at a first voltage and delivers it at a second, lower voltage.

A distribution transformer consists generally of a core and conductors that are wound about the core so as to form at least two windings. The windings (also referred to as coils) are insulated from each other, and are wound on a common core of magnetically suitable material, such as iron or steel. The primary winding or coil receives energy from an alternating current (AC) source. The secondary winding receives energy by mutual inductance from the primary winding and delivers that energy to a load that is connected to the secondary winding. The core provides a circuit or path for the magnetic lines of force (magnetic flux) which are created by the alternating current flow in the primary winding and which induce the current flow in the secondary winding. The core and windings are typically retained in an enclosure for safety and to protect the core and coil assembly from damage caused by the elements or vandalism.

The transformer windings or coils themselves are typically made of copper or aluminum. The cross section of the conductors forming the coil must be large enough to conduct the intended current without overheating. For small transformers, those rated less than 1 kVA, the coil wire may be insulated with shellac, varnish, enamel, or paper. For larger units, such as transformers rated 5 kVA and more, the conductor forming the coil is typically insulated with oilimpregnated paper. The insulation must provide not only for normal operating voltages and temporary overvoltages, but also must provide the required insulative levels during transient overvoltages as may result from lightning strikes or switching operations.

Distribution transformers used by the electric utilities in the United States operate at a frequency of 60 Hz (cycles per second). In Europe, the operating frequency is typically 50 Hz. Where the size and weight of the transformer are critical, such as in aircraft, transformers are typically designed to operate at a frequency of from 400 to 4,000 cycles per second. These high frequency applications allow the transformer to be made smaller and lighter than the 50 Hz and 60 Hz transformers designed for power distribution by the electric utilities.

The capacity of a transformer to transmit power from one circuit to another is expressed as a rating and is limited by the permissible temperature rise during operation. The rating of a transformer is generally expressed as a product of the voltage and current of one of the windings and is expressed in volt-amperes, or for practical purposes, kVA (kilovolt-amperes). Thus, the kVA rating of a transformer indicates the maximum power for which the transformer is designed to operate with a permissible temperature rise and under normal operating conditions.

Modem transformers are highly efficient, and typically operate with efficiencies in the range of 97–99%. The losses in the transformation process arise from several sources, but all losses manifest themselves as heat. As an example of the heat that is generated by even relatively small, fluid-filled distribution transformers, it is not uncommon for a 15 kVA mineral oil-filled transformer to operate with temperatures inside the transformer enclosure exceeding approximately 90° C. continuously.

A first category of losses in a transformer are losses resulting from the electrical resistance in the conductors that constitute the primary and secondary windings. These losses can be quantified by multiplying the electrical resistance in each winding by the square of the current conducted through the winding (typically referred to as $I^2R$ losses).

Similarly, the alternating magnetic flux (or lines of force) generates current flow in the core material as the flux cuts through the core. These currents are referred to "eddy currents" and also create heat and thus contribute to the losses in a transformer. Eddy currents are minimized in a transformer by constructing the core of thin laminations and by insulating adjacent laminations with insulative coatings. The laminations and coatings tend to present a high resistance path to eddy currents so as to reduce the current magnitudes, thereby reducing the $I^2R$ losses.

Heat is also generated in a transformer through an action known as "hysteresis" which is the friction between the magnetic molecular particles in the core material as they reverse their orientation within the core steel which occurs when the AC magnetic field reverses its direction. Hysteresis losses are minimized by using a special grade of heat-treated, grain-orientated silicon steel for the core laminations to afford its molecules the greatest ease in reversing their position as the AC magnetic field reverses direction.

Although conventional transformers operate efficiently at relatively high temperatures, excessive heat is detrimental to transformer life. This is because transformers, like other electrical equipment, contain electrical insulation which is utilized to prevent energized components or conductors from contacting or arcing over to other components, conductors, structural members or other internal circuitry.

Heat degrades insulation, causing it to loose its ability to perform its intended insulative function. Further, the higher the temperatures experienced by the insulation, the shorter the life of the insulation. When insulation fails, an internal fault or short circuit may occur. Such occurrences could cause the equipment to fail. Such failures, in turn, typically lead to system outages. On occasion, equipment can fail catastrophically and endanger personnel who may be in the vicinity. Accordingly, it is of utmost importance to maintain temperatures within the transformer to acceptably low levels.

To prevent excessive temperature rise and premature transformer failure, distribution transformers are generally provided with a liquid coolant to dissipate the relatively large quantities of heat generated during normal transformer operation. The coolant also functions to electrically insulate the transformer components and is often therefore referred to as a dielectric coolant. A dielectric coolant must be able to effectively and reliably perform its cooling and insulating functions for the service life of the transformer which, for example, may be up to 20 years or more. The ability of the fluid and the transformer to dissipate heat must be such as to maintain an average temperature rise below a predetermined maximum at the transformer's rated kVA. The cooling system must also prevent hot spots or excessive temperature rises in any portions of the transformer. Generally, this is accomplished by submerging the core and coil assembly in the dielectric fluid and allowing free circulation of the fluid. The dielectric fluid covers and surrounds the core and coil assembly completely and fills all small voids in the insulation and elsewhere within the enclosure where air or contaminants could otherwise collect and eventually cause failure of the transformer.

As the core and coil assembly is heated, the heat is transferred to the surrounding dielectric fluid. The heated fluid transfers the heat to the tank walls and ultimately to the surrounding air. Most conventional distribution transformers include a headspace of air or inert gas, such as nitrogen, above the fluid in the tank. The headspace allows for some expansion of the dielectric fluid which will occur with an increase in temperature. Unfortunately, the headspace is also a thermal insulator and prevents or diminishes effective heat transfer from the fluid to the tank's cover, since the cover is not "wetted," meaning it is not in contact with the fluid. In such designs, because the cover or the top of the transformer tank provides relatively little heat transfer or cooling, the cooling must be sustained by the other surfaces of the enclosure that are in contact with the fluid.

In order to improve the rate of heat transfer from the core and coil assembly, transformers may include a means for providing increased cooling, such as fins on the tank that are provided to increase the surface area available to provide cooling, or radiators or tubes attached to the tank that are provided so that the hot fluid that rises to the top of the tank may cool as it circulates through the tubes and returns at the bottom of the tank. These tubes, fins or radiators provide additional cooling surfaces beyond those provided by the tank walls alone. Fans may also be provided to force a current of air to blow across the heated transformer enclosure, or across radiators or tubes to better transfer the heat from the hot fluid and heated tank to the surrounding air. Also, some transformers include a forced oil cooling system which includes a pump to circulate the dielectric coolant from the bottom of the tank through pipes or radiators to the top of the tank (or from the tank to a separate and remote cooling device and then back to the transformer).

To effectively transfer heat away form the transformer core and coil assembly so as to maintain an acceptably low operating temperature, conventional transformers require relatively large volumes of dielectric fluid. For example, a standard 15 kVA pole mounted single phase distribution transformer housed in a cylindrical container and having a head space of air above the fluid may contain approximately ten gallons of fluid. Every gallon of fluid increases the weight of the transformer by approximately eight pounds. Thus, for the example given above, the fluid alone adds over eighty pounds to the transformer. The weight of the dielectric fluid also may require that a transformer enclosure be made of heavier gage steel than would be required for a smaller transformer, or may require that special or stronger hangers or supports be provided. Such additions also increase the weight and cost of the transformer. Obviously then, there are cost advantages and weight savings that can be obtained from a transformer design that will effectively dissipate heat using less-than-conventional volumes of dielectric coolant.

Obviously, the more dielectric fluid that must be utilized to effectively dissipate the heat in a transformer, the larger the transformer tank or enclosure must be. Unfortunately, increasing the size of the transformer has undesirable consequences even beyond the size and weight considerations discussed above. First, transformers, particularly the common pole mounted distribution transformers, are frequently mounted in areas congested by other electrical distribution equipment, including other transformers, conductors, fuses, and surge arrester, as well as by telephone and cable TV lines and cables. Important minimum clearances must be maintained between the energized transformer terminals and all other nearby equipment and lines and all grounded structures, including the transformer's own grounded tank. Accordingly, because of the height of conventional transformers, a dimension that, in great part, is dictated by the fluid volume required in the application, maintaining the appropriate clearance is ever-increasingly becoming a problem when trying to locate and mount the transformer.

Other significant drawbacks are directly associated with the size and weight of conventional transformers. Providing a transformer design that is smaller and lighter than conventional, similarly-rated transformers would save costs associated with shipping and storing larger and heavier equipment, and may ease installation difficulties and lessen installation costs given that a smaller transformer may not require the same equipment or personnel to install as a larger, heavier unit.

In many instances, however, reductions in the size of a transformer are limited by the effectiveness of the dielectric coolant. Many properties of a dielectric coolant affect its ability to function effectively and reliably. These include: flash and fire point, heat capacity, viscosity over a range of temperatures, impulse breakdown strength, gassing tendency, and pour point.

The flash and fire point of the fluid, as determined by ASTM D-92, are critical properties of a dielectric fluid. The flash point represents the temperature of the fluid that will result in an ignition of a fluid's vapors when exposed to air and an ignition source. The fire point represents that temperature of the fluid at which sustained combustion occurs when exposed to air and an ignition source. It is preferred that the flash point of a transformer fluid intended for general use be at least about 145° C. for reasonable safety against the various hazards inherent with low flammable fluids. Fluids intended for high fire point applications should have a fire point of at least about 300° C. in order to meet current specifications for high fire point transformer fluids.

Because dielectric fluids cool the transformer by convection, the viscosity of a dielectric coolant at various temperatures is another important factor in determining its effectiveness. Viscosity is a measure of the resistance of a fluid to flow. The flowability of dielectric coolants is typically discussed in terms of its kinematic viscosity, which is measured in stokes and is often referred to merely as "viscosity." The kinematic viscosity measured in stokes is equal to the viscosity in poises divided by the density of the fluid in grams per cubic centimeter, both measured at the same temperature. In the balance of this discussion, "viscosity" will refer to kinematic viscosity. With other factors being constant, at lower viscosities, a transformer fluid provides better internal fluid circulation and better heat removal. Organic molecules having low carbon numbers tend to be less viscous, but reducing the overall carbon number of an oil to reduce its viscosity also tends to significantly reduce its fire point. The desired insulating fluid possesses both an acceptably low viscosity at all temperatures within a useful range and an acceptably high fire point. A preferred dielectric coolant will have a viscosity at 100° C. no higher than 15 cS, and more preferably below 12 cS.

The pour point of a fluid also affects its overall usefulness as a dielectric coolant, particularly with regard to energizing equipment in cold climates. A pour point of −40° C. is considered to be an upper limit, while a maximum of about −50° C. is preferred. Pour point depressants are known, but their use in transformer fluids is not preferred because of the possibility that these materials may decompose in service with time. Also, even with the use of a pour point depressant, it may not be possible to achieve the desired pour point. Therefore, it is preferred that the unmodified transformer fluid have an acceptable pour point.

The gassing tendency of a dielectric coolant is another important factor in its effectiveness. Gassing tendency is determined by applying a 10,000 volt a.c. current to two closely spaced electrodes, with one of the electrodes being immersed in the transformer fluid under a controlled hydrogen atmosphere. The amount of pressure elevation in the controlled atmosphere is an index of the amount of decomposition resulting from the electrical stress that is applied to the liquid. A pressure decrease is indicative of a liquid that is stable under corona forces and is a net absorber of hydrogen.

Other important properties of dielectric coolants are as follows. A fluid's dielectric breakdown at 60 Hz indicates its ability to resist electrical breakdown at power frequency and is measured as the minimum voltage required to cause arcing between two electrodes submerged in the fluid. A fluid's impulse dielectric breakdown voltage indicates its ability to resist electrical breakdown under transient voltage stresses such as lightning and power surges. The dissipation factor of a fluid is a measure of the dielectric losses in that fluid. A low dissipation factor indicates low dielectric losses and a low concentration of soluble, polar contaminants.

In the past, various polychlorinated biphenyl (PCB) compositions have been used as dielectric coolants in transformers and other apparatus in order to overcome fire safety problems. PCB's have fallen into disfavor, however, due to their toxicity and capacity for environmental damage, detriments which are compounded by their resistance to degradation. Therefore, a suitable alternative to PCB's is desired. A suitable dielectric coolant must possess not only acceptable electrical and physical properties, but must also be less flammable as evidenced by a high fire point, be environmentally compatible, and be reasonably priced. Various substitutes for the PCB's have been proposed, but all are deficient as to one or more of these requirements.

Dimethyl silicone meets certain of the requirements for transformer fluids, but it is considered very expensive and is nonbiodegradable. It is also known to use hydrocarbon oils as dielectric coolants, but they are significantly deficient in some properties. For example, high molecular weight hydrocarbon oils that have fire points over 300° C. tend to have high pour points, in the range of 0° to −10° C., and therefore cannot be used in electrical equipment that is exposed to low ambient temperatures. On the other hand, low molecular weight mineral oils have lower pour points, but have fire points of well below 300° C. Some paraffinic oils have high fire points but also have unacceptably high viscosities and pour points. Likewise, while some naphthenic oils are suitably non-viscous, they tend to have low fire points and high pour points.

Because of these varying properties, mineral oils used as dielectric fluids are typically defined by their refined properties rather than by a defined composition. Naturally-occurring mineral oils vary in their composition based upon crude oil source and refining process. Additives are often required to make this refined product acceptable. More importantly, and especially so in recent years, the safety and environmental acceptability of mineral oils has come into question. Because mineral oils contain thousands of chemical compounds, it is impossible from a chemical and toxicological perspective to define accurately the composition and environmental effects of mineral-based oils. Therefore, it is desirable to provide a transformer fluid that comprises only a few, known chemicals, each of which is proven to be environmentally safe.

In addition, moisture, oxygen and environmental pollutants detrimentally affect the characteristics of dielectric fluids. Specifically, moisture reduces the dielectric strength of the fluid, while oxygen helps form sludge. Sludge is formed primarily due to the decomposition of mineral oil resulting from the oil's exposure to oxygen in the air when the fluid is heated.

To prevent such contaminants from entering the transformer tank, it is common practice to include a gasketed lid or cover on the transformer. A removable cover permits the transformer to be serviced, while the rubber gasket is intended to protect the integrity of the dielectric fluid; however, such gaskets are not the surest protection from contamination by moisture, oxygen or pollutants. For example, such gaskets are known to dry and crack with age. Further, some such cover assemblies are designed to function as a pressure relief means so as to relieve excessive pressure that may form within the transformer tank as the temperature rises. Sometimes a gasket will not properly reseal itself after a release. Likewise, the gasket may be misaligned or improperly installed when, for example, the cover is removed and replaced by service personnel.

As described briefly above, due to changes of temperature within the transformer enclosure, the volume of the headspace and of the fluid in the transformer tank will change. This produces a "breathing" or interchange of gas through the gasketed cover, as described above, or through another type of vent or pressure relief mechanism that typically is formed in the top of the transformer tank or cover. While a rise in temperature may cause the transformer to vent gas from the headspace outside the transformer, the lowering of temperature may draw air, oxygen and moisture into the tank. The breathing may also result in the lowering of the temperature of the enclosed air to a dew point, resulting in condensation of water vapor within the tank. The gradual accumulation of quantities of moisture will decrease the insulating quality of the dielectric fluid. Also, large drops of water may collect and, being heavier than oil, will fall towards the bottom of the transformer. These large drops of water may themselves displace dielectric fluid at such a location as to cause a breakdown in insulation and a resulting short circuit. Further, on occasion, an excessive temperature rise may cause a measure of dielectric fluid to be expelled from the transformer tank through the pressure relief device. This event may produce not only undesirable environmental consequences, but it also will decrease the transformer's capacity to dissipate heat. Depending upon such factors as the transformer's nominal fluid capacity, the volume of fluid lost during the overpressure event, the cumulative fluid losses from other such events, and the loading on the transformer, the life of the transformer may be significantly shortened by an increase in operating temperature caused by the loss of dielectric fluid.

Accordingly, despite the advances made in transformer and dielectric fluid technology, there remains a need in the art for a transformer that is smaller, lighter weight and that contains less dielectric coolant than conventional transformers. Preferably, the transformer enclosure would be completely and permanently hermetically sealed and non-venting such that no air, moisture or other environmental pollutants could enter the transformer and contaminate the dielectric fluid. Such a transformer should also prevent dielectric fluid from being expelled, thus protecting the environment and ensuring that the transformer's ability to self-cool will not be diminished. The dielectric fluid preferably should have a defined chemical composition and have no adverse environmental consequences. It would be especially desirable if the transformer would have a reduced height compared to conventional transformers so as to provide additional clearance. These and other objects and advantages of the invention will appear and be understood from the following description.

SUMMARY OF THE INVENTION

The invention advances the present day technology relating to transformers and other fluid-containing electrical apparatus. The invention provides an electrical apparatus having an expandable chamber that is permanently sealed from the ambient environment. The chamber contains a transformer core and coil assembly (or other current carrying conductor) in the sealed chamber and includes a dielectric liquid completely filling the chamber. The liquid is sealed in the chamber at an absolute pressure that is less than one atmosphere. It is preferred that the enclosure have flexible walls that are interconnected to form a noncylindrical enclosure having a polygonal cross-sectional area. No service port, gasketed cover or vent means is provided in the preferred enclosure. Instead, the sides of the enclosure flex inwardly and outwardly (toward the core and coil assembly and away from the core and coil assembly, respectively) as the dielectric fluid expands and contracts. Preferably, the chamber is allowed to expand to have a volume at least 10 to 15% greater than the volume possessed by the chamber when it is initially filled and sealed. Preferably, the dielectric fluid is sealed in the chamber at a pressure of about 1 to 7 p.s.i. below atmospheric pressure, and most preferably about 1 to 3 p.s.i. less than atmospheric pressure.

A duct may be provided in the internal chamber forming a fluid passageway for directing dielectric fluid that has been heated by the submerged core and coil assembly toward the top of the enclosure. The duct also provides at least one second fluid passageway for directing the descending, cooler fluid it drops toward the bottom of the enclosure. The duct provides for a smooth laminar flow of dielectric fluid within the enclosure and reduces fluid turbulence, thereby permitting the transformer to better dissipate the heat generated as a result of transformer losses. In one embodiment of the invention, the duct includes a chimney that surrounds the core and coil assembly and includes insulative standoffs forming longitudinally-aligned channels. The standoffs prevent the inwardly flexing sides of the transformer enclosure from obstructing the fluid passageways that convey the dielectric fluid. In an alternative embodiment, the duct comprises a plurality of strip members preferably attached in one or more comers of the polygonal enclosure. Such strips divide the chamber between a first, inner fluid passageway for conducting heated fluid toward the enclosure top and a plurality of outer fluid passageways for directing the cooler fluid as it drops toward the bottom of the tank. It is preferred that such strips be attached to the enclosure along only one of their edges to allow the enclosure sides the desired degree of flexure.

The dielectric fluid of the present invention comprises a mixture of hydrocarbons having a well-defined chemical composition. The physical properties of the blend can be tailored to meet the requirements of use in various electrical power distribution equipment, and in transformers in particular. The dielectric coolants of the present invention are particularly suited for use in sealed, non-vented transformers, and have improved performance characteristics as well as enhanced safety and environmental acceptability. The present dielectric coolants comprise relatively pure blends of compounds selected from the group consisting of aromatic hydrocarbons, polyalphaolefins, polyol esters, and natural vegetable oils.

The invention further includes a method for constructing a transformer that is completely filled with a dry, degassed dielectric fluid having a desired chemical composition. According to the invention, the fluid is filtered, dried and degassed. A vacuum is drawn in the transformer enclosure and, while maintaining a sub-atmospheric pressure in the transformer enclosure, the transformer is filled with the dried and degassed fluid. The transformer is then permanently sealed. Preferably, the fluid is dried to less than 10 ppm $H_2O$ and degassed to less than 100 microns of Hg prior to the transformer being filled.

To ensure that no gas enters the transformer enclosure while it is being filled, the preferred filling method includes the steps of providing a first wet header and a second wet header that has a larger volume than the first wet header, filling the first wet header and a portion of the second wet header with a predetermined volume of dried and degassed fluid while leaving a headspace in the second wet header, drawing a partial vacuum in the headspace of the second wet header, circulating the predetermined volume of fluid between the first and second headers, and transferring a measure of the predetermined volume of fluid from the first wet header into the transformer. Ensuring that substantially all gas is removed from the fluid before the transformer is filled greatly enhances the ability of the fluid and the transformer to dissipate heat and to do so with substantially less dielectric fluid than employed in a conventional transformer.

Thus, the present invention comprises a combination of features and advantages which enable it to substantially advance the art of transformer design and manufacture and related technologies by providing a completely and permanently hermetically sealed transformer and a preferred dielectric fluid that can not become contaminated or degrade due to the entrance of moisture, air or other pollutants. The transformer is substantially smaller and much lighter in weight than conventional transformers of equal rating. The device is significantly shorter than similarly-rated conventional transformers and thus may be installed in locations where maintaining the appropriate clearance from wires and other apparatus would otherwise be impossible or exceedingly difficult. The invention requires substantially less dielectric fluid than a conventional transformer, yet is able to adequately dissipate heat so as to avoid excessive temperature rise and premature transformer failure. The transformer prevents any dielectric fluid from being expelled and further employs a fluid having a defined chemical composition and having no adverse environmental consequences.

These and various other characteristics and advantages of the present invention will be readily apparent to those skilled in the art upon reading the following detailed description and referring to the accompanying drawings.

BRIEF DESCRIPTION OF THE DRAWINGS

For a detailed description of a preferred embodiment of the invention, reference will now be made to the accompanying drawings wherein.

DETAILED DESCRIPTION OF THE PREFERRED EMBODIMENTS

The present invention relates to electrical apparatus containing dielectric fluid for providing a cooling function or insulating energized electrical components, or both. Such apparatus includes transformers, circuit breakers, reclosers and other devices. A typical application of the invention is in transformers as are used in distributing electrical power to commercial and residential users. One of the most common types of such transformers is the pole mounted transformer. Accordingly, for purposes of example only, and not by way of limiting the present invention in any way, the invention will be described with reference to a single-phase, pole mounted, 15 kVA distribution transformer having a primary voltage of 7200 volts and a 120/240 volt secondary and operating at 60 Hz with a permissible temperature rise of 80° C. It should be understood, however, that the invention may take the form of other apparatus, and that the inventive concepts and features described and claimed below may be applied in other types and sizes of transformers, as well as in other types of fluid-containing electrical equipment.

Transformer Enclosure 12

Figure 1:
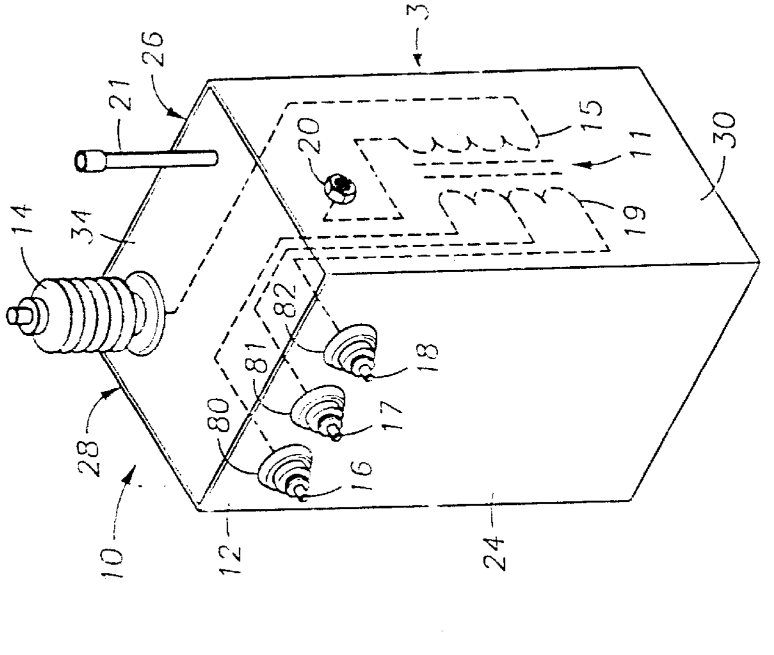
FIG. 1 is a perspective view of an electrical transformer made in accordance with the teachings of the present invention.

Referring first to FIG. 1, there is shown a perspective view of transformer 10, a preferred embodiment of the present invention. Transformer 10 generally comprises a core and coil assembly 11 (shown schematically in FIG. 1), an expandable enclosure or tank 12, high voltage bushing 14, low voltage bushings 16–18 and ground lug 20. Core and coil assembly includes primary winding 15 and secondary winding 19. Dielectric fluid 40 surrounds core and coil assembly 11 and completely fills enclosure 12, as best shown in FIG. 2.

Figure 3:
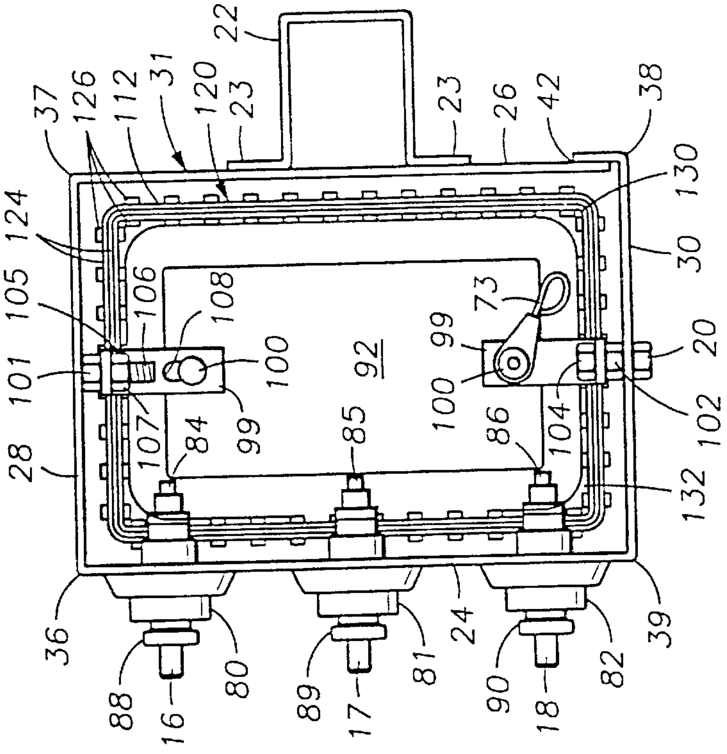
FIG. 3 is a top, plan view of the transformer of FIG. 1 shown with the cover removed and before the enclosure is filled with dielectric fluid.
Figure 2:
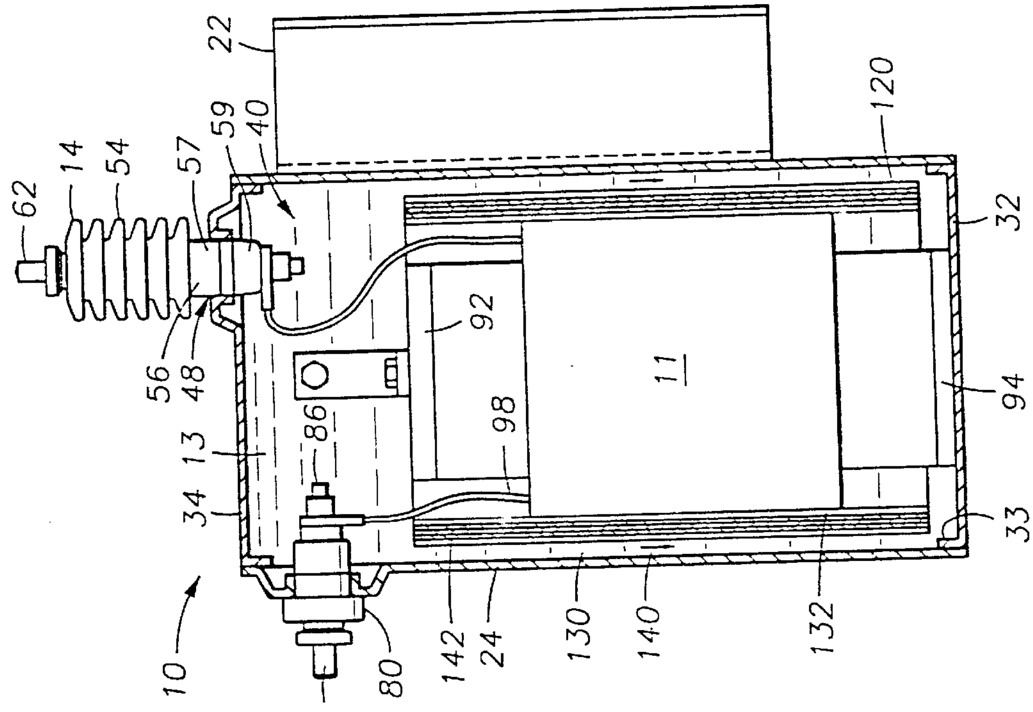
FIG. 2 is a side elevational view, partly in cross section, of the transformer shown in FIG. 1.

Referring now to FIGS. 1–3, enclosure 12 comprises a noncylindrical, box-like structure having expandable interior chamber 13. Enclosure 12 has a generally rectangular configuration and includes front wall 24, rear wall 26, side walls 28, 30, bottom wall 32 and top wall or cover 34. It is preferred that side walls 28 and 30 are substantially parallel to one another. Likewise, in the preferred embodiment shown, front wall 24 and rear wall 26 are substantially parallel to each other and generally perpendicular to side walls 28, 30. Accordingly, chamber 13 has a generally rectangular shaped cross sectional area.

Preferably, front wall 24, rear wall 26 and side walls 28, 30 are fabricated from a single length of sheet steel that is bent at right angles at the appropriate places so as to form a generally four-sided body portion 31 having a generally rectangular shaped cross section and corners 36–39. The ends of the steel sheet are then overlapped and welded together along seam 42 (FIG. 3) to create body portion 31.

Enclosure or tank 12 is approximately 16½ inches high (as measured between bottom wall 32 and top wall or cover 34), approximately 11 inches wide (as measured between side walls 28 and 30) and approximately 9 inches deep (measured between front wall 24 and rear wall 26). Enclosure 12 is preferably made from 0.040 inch thick sheets of 400 series stainless steel. Given the above-stated dimensions of enclosure 12, this material has the strength and rigidity necessary to support the internal transformer core and coil assembly 11, the volume of dielectric fluid 40, and the other transformer components, without the necessity of a separate frame. Enclosure 12 having these dimensions thus has a surface area of substantially 858 square inches.

As will be understood by those skilled in the art, the dimensions given above are intended to be employed in the enclosure of one particularly-sized and rated transformer 10, although the principles of the present invention may be employed a wide variety of transformer sizes, ratings and types. Preferably, however, without regard to the size or shape of the core and coil assembly 11 housed by the transformer enclosure 12, the body portion 31 should conform closely to the footprint or overall shape of the core and coil assembly 11. In this manner, and by employing the principles of the present invention, the transformer enclosure 12 and interior chamber 13 may contain less dielectric fluid and be smaller than a transformer conventionally employed today and having the same core and coil assembly.

Bottom wall 32 of enclosure 12 is a generally flat and rectangularly-shaped steel sheet with its edges bent to form flanges 33 (FIG. 2). Bottom wall 32 is slightly smaller than the rectangular opening of enclosure body 31. Upon assembly, bottom wall 32 is inserted into body portion 31 and bottom flanges 33 are welded to enclosure body 31 along the entire perimeter of bottom wall 32. Bottom wall flanges 33 provide additional strength to the transformer enclosure 12 adjacent to its lower end so as to prevent damage during handling and prior to installation. Bottom wall 32 further includes an embossed or stamped raised portion or dimple 35 (FIG. 11) provided for properly positioning and orienting core and coil assembly 11 as explained more fully below.

Figure 7:
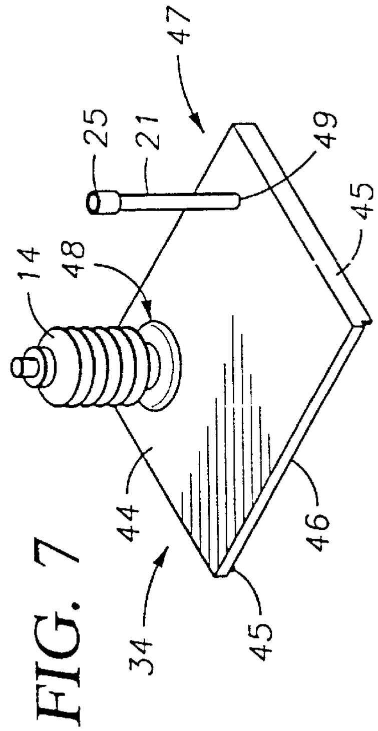
FIG. 7 is a perspective view of the cover of the transformer tank shown in FIG. 1.

Top wall or cover 34 is best shown in FIGS. 1 and 7 and generally includes upper surface 44, side flanges 45, and front and rear flanges 46, 47 respectively. Cover 34 is a generally flat and rectangular-shaped steel sheet, preferably made from a single piece of stainless steel that is cut and bent so as to produce flanges 45–47. Upper surface 44 of cover 34 includes bushing mounting aperture 48 and fill tube aperture 49. Cover 34 is slightly smaller than the rectangular opening of enclosure body 31. Upon assembly of transformer 10, cover 34 is inserted into the upper end of body portion 31 and flanges 45–47 are welded to body portion 31 of enclosure 12 along the entire perimeter of cover 34. As shown in FIG. 7, front flange 46 is shorter than rear flange 47 and side flanges 45 to allow clearance for the inwardly-disposed portions of the low voltage bushings 16–18 (FIG. 3).

A hanger bracket 22 (FIGS. 2, 3) is attached to rear wall 26 and serves as a means to mount transformer 10 on a pole or other support. Hanger 22 is preferably formed of 70 gage 400 series stainless steel, and includes a pair of flanges 23 that are approximately 3 inches wide and welded to rear wall 26. In this preferred embodiment, hanger 22 has a length that is only slightly less than the height of rear wall 26 so as to provide added rigidity and strength to rear wall 26. Other hanger lengths and other style hangers may also be employed.

No service port or removable cover is provided in preferred enclosure 12. Once cover 34 is permanently affixed to body portion 31 and the transformer 10 is filled with dielectric fluid 40 and sealed (described more fully below), the core and coil assembly 11 is permanently sealed within chamber 13 and is unserviceable. That is, enclosure 12 would have to be cut and portions removed if it were desired to inspect, repair or replace any internal transformer components. Similarly, enclosure 12 includes no pressure relief valves, rupture disks, gasketed closures or other venting means. Unlike many prior art designs that were described as "sealed" or "hermetically sealed," transformer 10 is non-venting and thus is completely and permanently hermetically sealed. Ungasketed and permanently sealed enclosure 12 prevents any gasses or liquids from entering or leaving chamber 13 under all operating conditions for the entire service life of the transformer.

Figure 10:
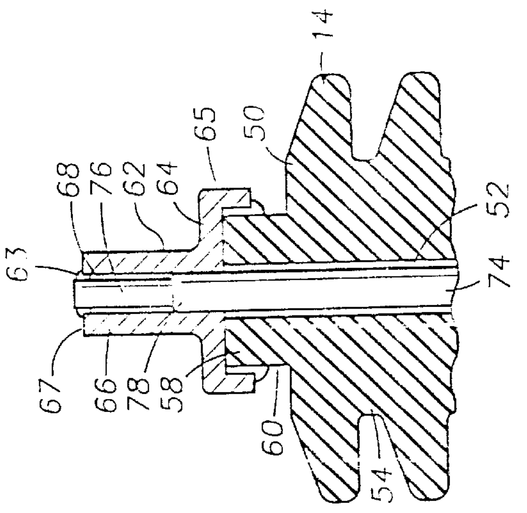
FIG. 10 is a cross sectional view of the high voltage bushing of the transformer shown in FIG. 1.

Referring now to FIGS. 2 and 10, high voltage bushing 14 is seated in aperture 48 of enclosure cover 34 and provides a means to interconnect transformer high voltage winding 15 to a line potential conductor (not shown). A suitable construction and process for manufacturing high voltage bushing 14 and sealingly-attaching bushing 14 to enclosure 12 is described in U.S. Pat. No. 4,846,163, the disclosure of which is hereby incorporated by this reference. Accordingly, the method of constructing bushing 14 and sealingly attaching it to enclosure 12 need only be briefly described herein.

Bushing 14 generally comprises conductive end cap 62 and an insulative body 50 having an upper ribbed portion 54, a lower portion 56 and a central bore 52. Lower portion 56 is disposed in aperture 48 and is slightly tapered such that a first segment 57 of lower portion 56 has a diameter greater than that of aperture 48 and is disposed outside enclosure 12. A second segment 59 of lower portion 56 has a diameter less than that of aperture 48 and extends inside enclosure 12.

Bushing body 50 is preferably made of porcelain. To secure bushing body 50 to cover 34 and to seal aperture 48, the surface of lower portion 56 adjacent the intersection of first and second segments 57, 59 is first coated with a silver-filled, lead bearing flit. Next, a second coating of silver-filled, lead bearing frit is applied to the same surface, this second frit having a larger proportion of silver filler and a lesser proportion of lead binder than the first frit. Frits having other fillers and binders may also be employed. The bushing is thereafter fired to cause a bonding on a molecular level between the first coating and the porcelain and between the first and second coating. Upon assembly of transformer 10, lower portion 56 is disposed through aperture 48 and the now-silver-coated surface of bushing body 50 is soldered to cover 34 along the entire perimeter of bushing body 50 and aperture 48. The solder both secures bushing 50 to cover 34 and seals cover 34 at aperture 48.

As best shown in FIG. 10, ribbed portion 54 of bushing body 50 includes an upper cylindrical extension 58 having outer surface 60. Conductive end cap 62 is preferably made of tin plated copper or cooper alloys and includes base portion 64, stud portion 66 and central bore 68. Base 64 includes circular flange 65. Base portion 64 of end cap 62 is disposed on cylindrical extension 58 such that central bore 68 is axially aligned with bore 52 of bushing body 50. Conductive cap 62 is sealingly attached to cylindrical extension 58 in the manner previously described with reference to sealing and securing lower portion 56 of bushing body 50 to cover 34. More specifically, first and then second layers of silver-filled lead bearing frit are sequentially applied to cylindrical extension 58. After the frit and porcelain bushing have been fired, flange 65 of base cap 64 is soldered to cylindrical extension 58 along the entire perimeter of extension 58 and flange 65.

A transformer primary lead 74 interconnects primary winding 15 with bushing 14. Lead 74 is preferably an insulated wire conductor having an uninsulated end 76 which is disposed through silicon rubber sheath 78. Sheath 78, containing primary lead end 76, is disposed through central bore 52 of bushing body 50. Uninsulated end 76 terminates on conductive cap 62. To terminate lead end 76 and seal aligned bores 52 and 68, uninsulated end 76 of primary lead 74 is soldered to the terminus 67 of stud portion 66 of end cap 62, as generally shown at 63. To maintain the required clearance, high voltage bushing 14 extends approximately 8 inches above cover 34. Thus, as measured from terminus 67 of bushing 14 to bottom wall 32 of enclosure 12, the overall height of transformer 10 is approximately 24½ inches.

Low voltage bushings 16, 17, 18 are constructed and sealingly attached to enclosure 12 in substantially the same way as described above for high voltage bushing 14. In general, bushings 16, 17, 18 include insulative bodies 80, 81, 82, respectively, which are preferably made of porcelain and include central bores (not shown). Insulative bodies 80–82 extend through apertures formed in front wall 24 of enclosure 12 and are soldered to enclosure 12 to secure the bushings and seal the enclosure. Bushings 16, 17 and 18 further include conductive studs 84–86 and terminal end caps 88–90. Each end cap 88–90 includes an aperture (not shown) and is soldered to the outermost end of an insulative bushing body 80–82 such that its aperture is aligned with the central bore of the insulative body. Conductive studs 84, 85, 86, which are preferably made of copper alloys, are disposed through the central bore of insulative bodies 80, 81, 82, respectively (as best shown in FIG. 3) and through the apertures formed in end cap 88–90. The required seal between studs 84–86 and insulative bodies 80–82 is provided by soldering each stud to the end cap adjacent to the end cap's aperture. Conventional terminal lugs may then be connected to the extending ends of end caps 88–90 to provide a means for interconnecting the secondary winding 19 to distribution conductors (not shown).

The preceding paragraphs have described the preferred embodiment for primary bushing 14 and secondary bushings 16–18. It will be understood, however, that other types of bushings may be used. It is important, however, that each bushing be completely sealed to enclosure 12 to prevent the ingress and egress of air, moisture, fluids and other contaminants. Likewise, it will be understood by those skilled in the art that the transformer 10, depending on its application, may have more or fewer bushings than those shown and described above. For example, a three phase pole mount distribution transformer will include three bushings similar to that described above with reference to bushing 14. Once again, without regard to the number of bushings, each bushing must be completely sealed to enclosure 12.

Core and coil assembly 11, best shown in FIG. 2, is disposed within sealed chamber 13 of enclosure 12 and is seated against bottom wall 32. Core and coil assembly 11 may be any conventional assembly having the appropriate size and rating for the load and duty for which the transformer 10 is to be applied. The assembly may be a shell type or core type. The core itself may be either a wound core or a stacked lamination core. In the preferred embodiment described herein, core and coil assembly 11 is identical to that presently manufactured by Cooper Power Systems, a division of Cooper Industries, Inc. and sold in a cylindrical, pole mounted 15 kVA transformer, Cooper Catalog No. EADHL 11072.

Figure 11:
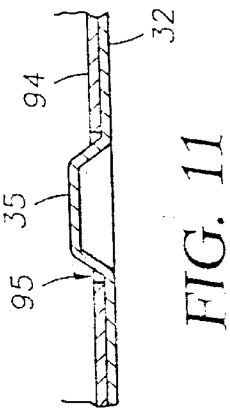
FIG. 11 is a cross sectional view showing the transformer core and coil assembly seated on the bottom wall of the transformer tank.

As understood by those skilled in the art, the core and coil assembly 11 includes top and bottom clamps 92, 94 that apply compressive force to the assembly 11. The top and bottom clamps 92, 94 include a central aperture 95. The core and coil assembly 11 is disposed in tank 12 and rests directly against bottom wall 32. To properly position core and coil assembly 11 within enclosure 12 and maintain the desired spacing between assembly 11 and enclosure body portion 31, aperture 95 in bottom clamp 95 is disposed about the indentation or dimple 95 formed in bottom wall 32 as shown in FIG. 11.

Figure 6:
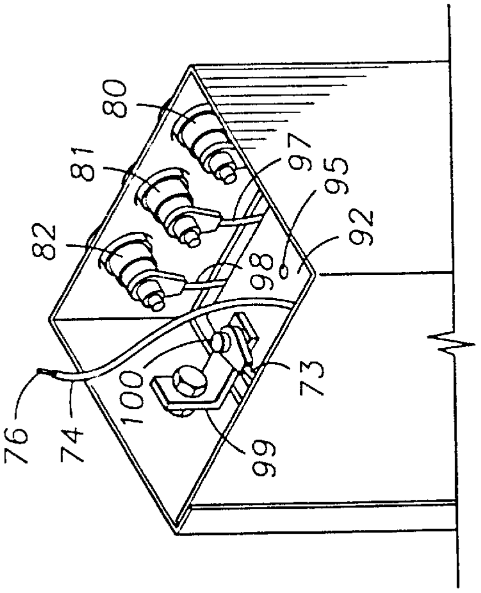
FIG. 6 is a perspective view showing the core and coil assembly of FIG. 5 mounted within the transformer tank and electrically connected to the secondary terminals.
Figure 5:
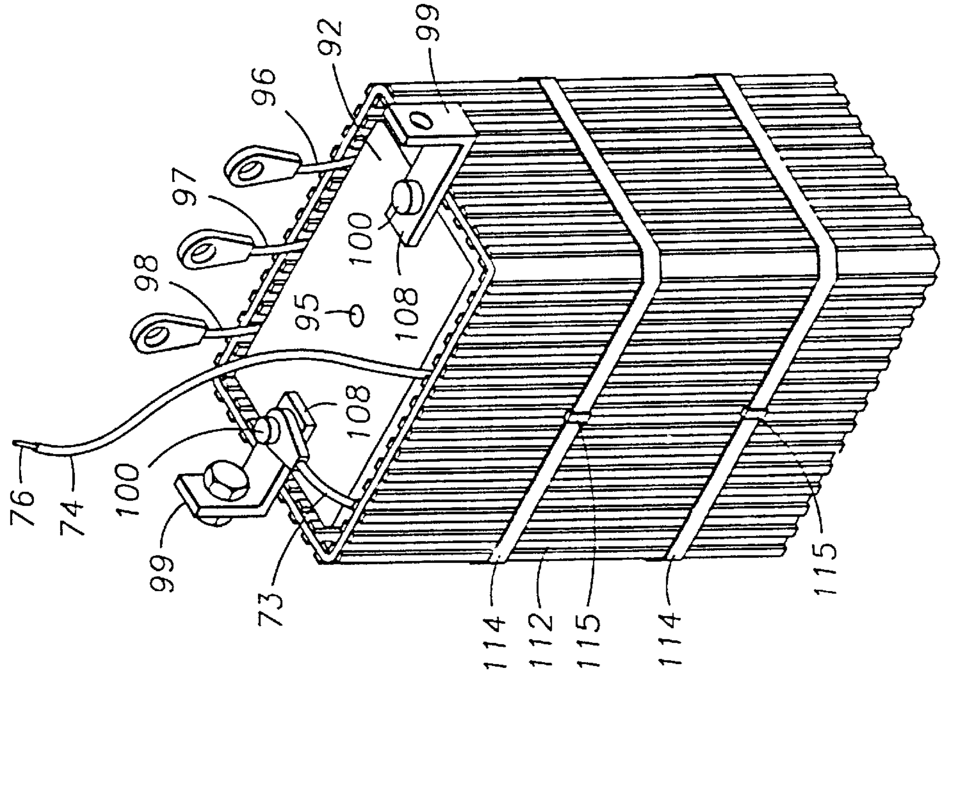
FIG. 5 is a perspective view of the core and coil assembly of the transformer shown in FIG. 1 before the assembly is installed in the transformer tank.

As best shown in FIGS. 3, 5 and 6, upper clamp 92 of core and coil assembly 11 is attached to enclosure 12 in two places by means of L-shaped brackets 99. A first leg of each L-shaped bracket 99 is attached to upper clamp 92 by means of conventional fastener 100. Fastener 100 also electrically connects one end of ground lead 73 to bracket 99, the opposite end of lead 73 being connected to high voltage winding 15. Secondary leads 96–98 interconnect the secondary winding 19 of transformer 10 to conducting studs 84, 85, 86, by conventional termination means, best shown in FIGS. 2 and 3. Lugs 101, 102 include threaded bores and are welded to sides 28, 30 inside enclosure 12 for receiving threaded fasteners 104, 105, respectfully, which are employed to attach the upwardly extending leg of L-shaped brackets 99 to enclosure 12. As best shown in FIG. 3, threaded fastener 105 may comprise an elongate threaded stud 106 and nut 107 which may be employed so as to permit mounting of core and coil assembly 11 in enclosures 12 of varying sizes. Likewise, slots 108 may be formed in the leg of L-shaped bracket 99 that is disposed against upper clamp 92 to provide an additional adjustment means.

Referring again to FIGS. 1 and 7, transformer 10 is further provided with a fill tube 21 that is disposed in aperture 49 in cover 34. Tube 21 is preferably made of tin coated copper or copper alloys and is attached and sealed to cover 34 by means of a solder seal. After the core and coil assembly 11 is secured within enclosure 12 and cover 34 is welded to body portion 31 of enclosure 12, interior chamber 13 of enclosure 12 is completely filled with the dielectric fluid 40. As described more fully below, interior chamber 13 of transformer enclosure 12 is completely filled with dielectric fluid 40 such that no head space or any trapped air will be contained within enclosure 12.

Duct Member 120

Figure 4:
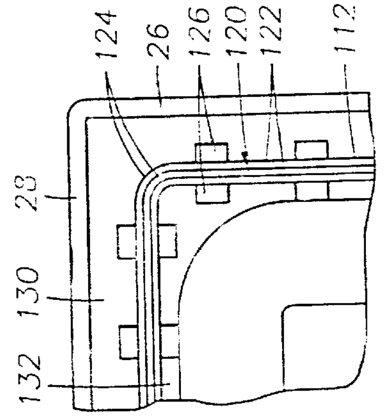
FIG. 4 is an enlarged plan view of a portion of the transformer assembly shown in FIG. 3.

Referring now to FIGS. 2–4, transformer 10 includes a chimney or duct member 120 disposed about core and coil assembly 11. Duct member 120 is substantially impermeable to the flow of dielectric fluid 40 through its thickness. Duct member 120 is spaced apart from body portion 31 of enclosure 12 to form an annular fluid passageway 130 between duct 120 and body portion 31 of enclosure 12. Likewise, duct 120 is spaced apart from the core and coil assembly 11 to form an annular fluid passageway 132 therebetween.

As best shown in FIG. 4, in the preferred embodiment, duct member 120 comprises a high voltage barrier 112 and two layers of insulative material 122, each layer 122 having a base sheet of insulative material 124 and a plurality of spaced-apart, elongate, insulative standoffs 126 attached to the base sheet. Standoffs 126 are substantially parallel to enclosure walls 24, 26, 28, 30 and perpendicular to the bottom wall 32 so as to form longitudinally-aligned parallel channels 128 between adjacent standoffs 126. Preferably, channels 128 extend the length of duct 120 and are perpendicular to cover 34 and bottom wall 32.

In the preferred embodiment shown in FIG. 4, chimney or duct 120 is formed by sandwiching barrier 112 between two insulative layers 122. In this configuration, the base sheets 124 contact barrier 112 while the insulative standoffs 126 of the two sheets 124 are separated from each other by the two thicknesses of sheets 124 and the thickness of barrier 112. Standoffs 126 add rigidity and strength to duct 120, but serve primarily to maintain a predetermined minimum amount of separation between sheets 124 and enclosure 12 and between sheets 124 and core and coil assembly 11, such that annular fluid passageways 130, 132 remain unobstructed.

More specifically, and as explained in greater detail below, walls 26, 28, 30, 32 are flexible and, in varying measure, will tend to bow inwardly toward core and coil assembly 11 when interior chamber 13 is filled with dielectric fluid 40 and sealed. Because the shape of body portion 31 of enclosure 12 conforms quite closely to the overall footprint of the core and coil assembly, there is relatively little clearance between the inner surfaces of walls 26, 28, 30 and 32 and the outermost surfaces of core and coil assembly 11 which define the overall footprint of assembly 11. Without providing standoffs 126 in duct 120, the inwardly flexing walls would, at certain locations, press ione base sheet 124 against the core and coil assembly and the other against the inner surface of the inwardly-bowed walls, thus obstructing the desired fluid flows. Thus, standoffs 126 ensure that passageways 130 and 132 remain open to fluid flow through the longitudinally-aligned channels 128.

Barrier 112, insulative sheets 124 and standoffs 126 may be made of a conventional high voltage barrier material. For example, barrier 112 and insulative sheets 124 may be a kraft paper, and standoffs 126 may be formed of kraft pressboard. Thus constructed, duct member 120 will provide the desired level of insulation between enclosure 12 and core and coil assembly 11 even when the walls of enclosure 12 may be inwardly bowed so a to press duct 120 against core and coil assembly 11. It will be understood that barrier 112 may be formed from several sheets or thickness of kraft paper as may be necessary to provide the required insulation.

Duct member 120 is retained in position within enclosure 12 by means of bands 114, made of nylon or other suitable materials, and band clips 115. As best shown in FIG. 2, duct 120 is sized to extend a predetermined distance above and below the height of the windings 15, 19. Preferably, duct 120 is sized such that the upper and lower ends of duct 120 are spaced apart from the cover 34 and bottom wall 32 of enclosure 12 a distance sufficient to allow for relatively unrestricted fluid circulation between fluid passageways 130, 132, as described below.

In operation, when transformer 10 is energized, the dielectric fluid 40 surrounding core and coil assembly 11 in chamber 13 will be heated to temperatures of approximately 65° C. or more. Because duct member 120 is substantially impermeable to the flow of dielectric fluid 40 therethrough, natural convection forces will drive the heated fluid upward within fluid passageway 132 as represented by arrows 142 in FIG. 2. Duct member 120 thus prevents the fluid having the greatest temperature from contacting body portion 31 of enclosure 12 until the fluid has reached the top of the duct member 120. Above duct member 120, the heated fluid that has been channeled upward through fluid passageway 132 mixes with cooler fluid 40 that has undergone cooling by transferring heat to tank cover 34 and the upper portions of tank walls 24, 26, 28, 30. The cooler fluid 40 then falls toward the bottom of enclosure 12 through fluid passageway 130 as represented by arrows 140 in FIG. 2. As the fluid 40 passes down through passageway 130, it undergoes further cooling by transferring heat to the central and lower portions of tank walls 24, 26, 28, 30. Still further cooling takes place at the bottom wall 32. To enhance cooling at the bottom of enclosure 12, it is preferred that bottom wall 32 be flush with the ends of tank walls, 24, 26, 28, 30 rather than being recessed. Recessing bottom wall 32 hampers air movement along the bottom wall 32 and thus decreased cooling efficiency at that surface. For similar reasons, top or cover 34 is attached flush with the upper ends of tank walls 24, 26, 28, 30.

Figure 9:
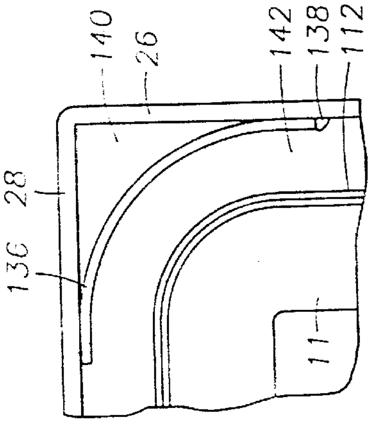
FIG. 9 is a view similar to FIG. 4 showing an alternative embodiment of the present invention.

Duct 120 may be constructed in a variety of other ways and of many other materials. For example, an alternative embodiment of duct member 120 is shown in FIG. 9. Referring momentarily to FIG. 9, duct 120 may be formed by providing a sleeve member 136 in each comer or in selected comers of chamber 13 of enclosure 12. Sleeve member 136 is an elongate strip of sheet material shaped so as to approximate the curvature of that portion of the core and coil assembly 11 that is adjacent to the sleeve member 136. Sleeve member 136 extends above and below windings 15, 19 but does not extend all the way to cover 34 or to bottom wall 32 in order to permit the desired circulation of fluid 40 as previously described with reference to FIGS. 2–4. In this alternative embodiment, sleeve member 136 is preferably made of steel and is welded along one edge to one wall of enclosure body 31, shown generally as weld bead 138. Attaching only one edge of sleeve member 136 to enclosure 12 may eliminate stress that may otherwise be induced in enclosure 12 by the welding process or by the thermal expansion of sleeve member 136 during transformer operation. Also, attaching sleeve member 136 along only one edge and to only one wall of the enclosure will prevent sleeve member 136 from impeding the adjacent walls from undergoing the degree of flexure that is desired.

Sleeve member 136 may be made of materials other than metal, both insulative or conductive, and may be attached to enclosure 12 in a variety of ways. What is important is that the sleeve member 136 and attachment means be inert with respect to the dielectric fluid 40, and that the sleeve members 136 generally define an inner fluid passageway 142 and outer fluid passageways 140. Inner passageway 142, which surrounds core and coil assembly 11, causes the dielectric fluid 40 that is heated by the core and coil assembly 11 to be driven upward in enclosure 12. Passageways 142 provide ducts for the cooler fluid to drop to the bottom of enclosure 12. In this embodiment, it is preferred that a sleeve member 136 be disposed in each comer of enclosure 12 such that four longitudinally-aligned fluid passageways 140 are disposed in spaced-apart locations about inner passageway 142. Also, because in this embodiment an insulative material 122 does not completely surround core and coil assembly 11, core and coil assembly 11 is wrapped with a layer of high voltage barrier material such as high voltage barrier 112 previously described. Barrier 112 serves as an insulative barrier to prevent energized portions of the windings 15, 19, particularly the terminal where primary lead 76 interconnects with high voltage winding 15, from contacting grounded enclosure 12. Preferably, insulative barrier 112 is secured about core and coil assembly 11 by banding, such as bands 114 previously described. Paper barrier 112 is a convenient means for ensuring that core and coil assembly 11 is completely insulated; however, any of a number of other suitable means may be employed. Without regard to the type or construction of duct member 120, the duct 120 provides a means for reducing turbulence and ensuring a uniform laminar flow of dielectric fluid 40 within chamber 13 of enclosure 12 as is desired for optimum heat dissipation. It is preferred that the fluid heated by contact with a transformer core and coil assembly quickly be directed away from the assembly to relatively cool tank walls in order to effectively dissipate the heat. Without duct 120, the fluid movement within chamber 13 caused by the heating and cooling of fluid 40 would tend to be undirected and disorganized. As such, the flow of the hottest fluid rising toward the top of the enclosure would be impeded by the flow of cooler fluid falling toward the bottom of the tank. The turbulence caused by the intersection of these flows slows the fluid flows and increases the time required for the fluid and transformer enclosure to dissipate the heat generated by the core and coil losses. By contrast, duct 120 coordinates and directs the fluid flows, thereby increasing the flows' velocity and the capacity of the fluid and enclosure to more quickly dissipate heat.

Dielectric Coolant 40

A dielectric fluid must possess a number of important characteristics. It must transfer heat effectively, have an appropriate dielectric strength, and should not possess ingredients harmful to the environment. It has been found that certain mixtures of particular classes of compounds satisfy both the requirements for suitability as dielectric coolant and the requirements relating to environmental compatibility. Those mixtures consist of two or more compounds selected from the following classes: aromatic hydrocarbons, polyalphaolefins, polyol esters and triglycerides derived from vegetable oils, as described below.

I. Aromatic Hydrocarbons

Aromatic hydrocarbons consist of one or more unsaturated benzene ring-type structures which may be linked together directly or through hydrocarbon bridges. Aromatic hydrocarbons may be substituted with various hydrocarbon radicals, including —$CH_3$ (methyl), —$C_2H$, (ethyl), —$C_3H_7$ (Propyl), etc., by alkylation of the benzene ring.

A preferred class of aromatic hydrocarbon according to the present invention are diaryl ethanes of the general formula:

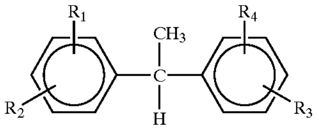

where $R_1$, $R_2$, $R_2$ and $R_4$ are H or —$CH_3$, and diaryl methanes of the general formula:

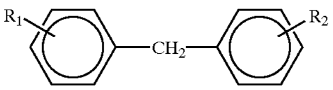

where $R_1$ and $R_2$ are H or CH3. A specific example of a preferred diaryl ethane is:

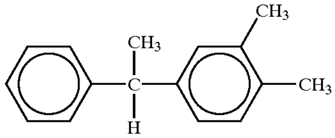

A specific example of a preferred diaryl methane is:

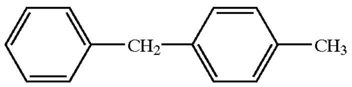

In addition, triaryl methanes and triaryl ethanes, molecular compositions containing three aromatic rings linked by methylene or ethane bridges respectively, can be employed in the present dielectric coolant. Triaryl methanes have the general formula

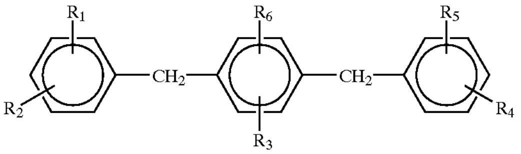

or

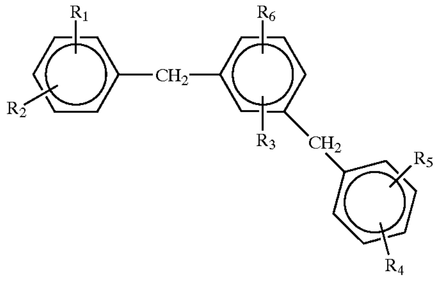

and triaryl ethanes have the general formula

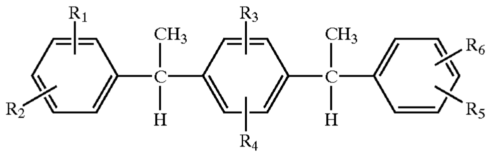

where $R_1$, $R_2$, $R_3$, $R_4$, $R_5$ and $R_6$ are H or —$CH_3$. In a preferred triaryl methane, at least two of the R groups are methyl. In a preferred triaryl ethane, $R_3$ and $R_4$ are H and $R_1$, $R_2$, $R_5$, $R_6$ are all —$CH_3$.

In addition to the methylene and ethane bridged diaryl compounds, the benzene rings may be connected directly to form a biphenyl group. The preferred biphenyls are alkykated biphenyls having the formula

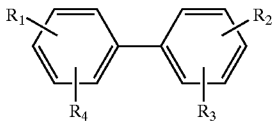

where $R_1$, $R_2$, $R_3$ and $R_4$ may be H, $CH_3$, $CH_2CH_2CH_3$, $CH_3CHCH_3$, $CH_2CH_2CH_2CH_3$ or $CH_3CH_2CHCH_3$, with at least one of the R group being an alkyl group. Specific examples of preferred biphenyl include:

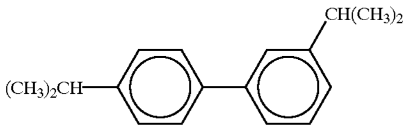

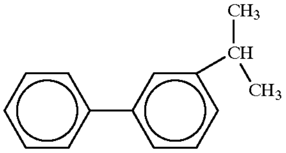

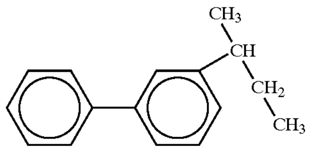

The alkylated biphenyls may be used alone or in mixture with other aromatic hydrocarbons to provide useful blend for this invention.

Monoaromatics with larger alkyl groups may also be used in the present blend. The general formula for the preferred monoaromatics is

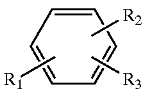

where $R_1$ is H or $C_2$ to $C_{20}$, $R_2$ is H or $C_6$ to $C_{20}$ and $R_3$ is H or $C_6$ to $C_{20}$. A specific useful monoaromatic is

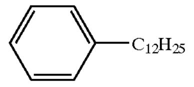

Naphthalenes having the general formula

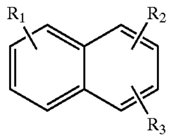

where $R_1$, $R_2$ and $R_3$ are H or $C_1$ to $C_4$, are also suitable, with a specific example of a preferred naphthalene being

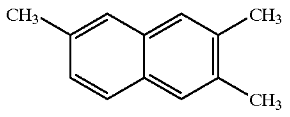

II. Polyalphaolefins (PAO's)

Polyalphaolefins (PAO's) are derived from the polymerization of olefins where the unsaturation is located at the 1, or alpha, position. The preferred products are based upon hexene ($C_6$), octene ($C_8$), decene ($C_{10}$) or dodecene ($C_{12}$). If an alpha olefin mononer is polymerized with itself one or more times, the resultant molecules are polyalphaolefins. According to the present invention, the preferred polyalphaolefins have the formula:

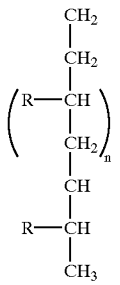

where R is a $C_4H_9$, $C_6H_{13}$ $C_8H_{17}$ or $C_{10}H_{21}$ saturated straight chain alkyl group and n=0, 1, 2, 3, or 4.

The polyalphaolefins suitable for use in the present invention include mixtures of oligomers as well as single oligomers. For example, a mixture containing dimers, trirers, tetramers and pentamers can be used. Furthermore, the constituent oligomers need not be based on a single alphaolefin. Primary factors in determining the suitability of a particular polyalphaolefin mixture are its kinematic viscosity and pour point.

The kinematic viscosity of polyalphaolefins is partly dependent on the degree of polymerization and the length of the carbon chains that make up the base monomer. It will be understood that the viscosity of some polyalphaolefins will make them unsuitable for use as dielectric coolants. The polyalphaolefins described above generally have sufficiently low viscosities to function in the desired manner. Preferred polyalphaolefins have kinematic viscosities in the range of about 2 to about 15 cS. at 100° C.

III. Polyol Esters

Polyol esters result from the chemical combination of polyalcohol compounds with organic acids containing a variety of alkyl groups. The chain length of the alkyl group on the polyol ester will be between $C_5$ and $C_{20}$. The substitution in the polyol ester may be the same, i.e. all the same alkyl group, or the molecule may contain different alkyl chains. Branched alkyl chains are preferred. The preferred polyols are neopentyl glycol (1), trimethylolpropane (2), and pentaerythritol (3).

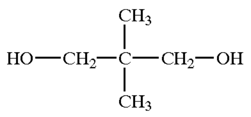

(1)

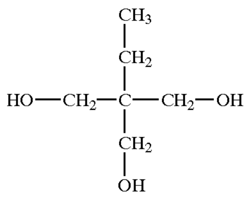

(2)

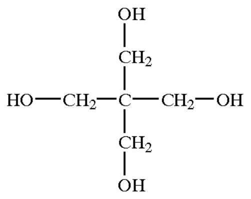

(3)

To form the preferred esters, these are combined with monoacids having the following general formula:

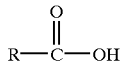

where R is a branched or unbranched alkyl group with carbon chain lengths of $C_5$ to $C_{10}$, $C_{12}$, $C_{14}$ or $C_{16}$ or mixtures thereof. The preferred polyols form polyol esters having the following formulas, respectively:

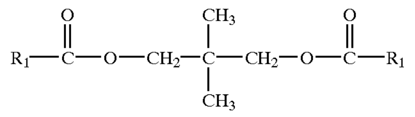

(1a)

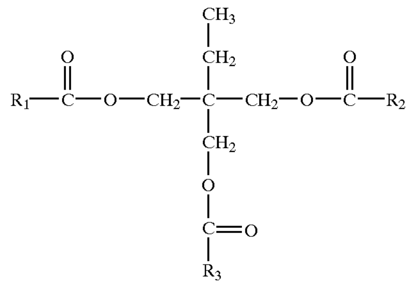

(2a)

-continued (3a)

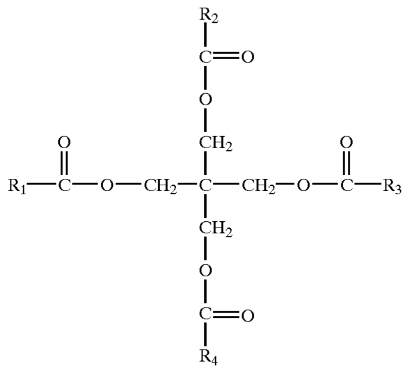

where each of $R_{1-4}$ are the same or different and are selected from the $C_5$ to $C_{10}$, $C_{12}$, $C_{14}$ and $C_{16}$ alkyl groups described above. A particularly preferred polyol ester has the following formula:

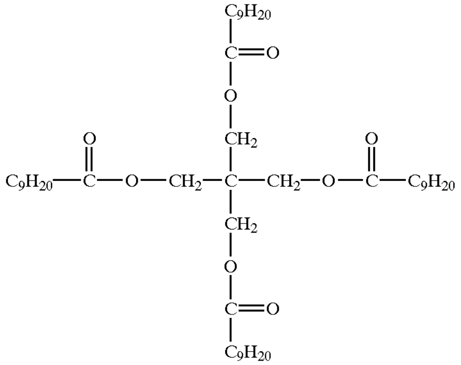

wherein each alkyl carbon chain can be branched or unbranched.

IV. Vegetable Oils

Vegetables oils are natural products derived from plants, and most commonly from plant seeds. The oils are a source of a general class of compounds known as triglycerides, which derive from the chemical combination of glycerin with naturally occurring mono carboxylic acids, commonly referred to as fatty acids. Fatty acids are classified by the number of carbons contained in the alkyl chain and by the number of carbon double bonds incorporated into the carbon chain of the fatty acid.

A fatty acid molecule is generally the same as the mono acid drawn above, except that the hydrocarbon R group may also be mono-unsaturated or poly-unsaturated, with the number of unsaturated double bonds varying from zero to three. A common mono-unsaturated acid, oleic acid, has a chain length of eighteen carbons with one double bond always located between carbon 9 and carbon 10 position. Likewise a common poly-unsaturated acid, linoleic acid, has eighteen carbons with two unsaturated bonds.

The combination of three saturated, mono- or poly-unsaturated fatty acids having carbon chain lengths of from four carbons to twenty-two carbons with glycerin forms a triglyceride molecule with the general formula:

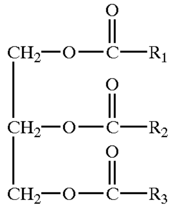

where $R_1$, $R_2$ and $R_3$ may be the same or different with carbon chains from $C_4$ to $C_{22}$ and levels of unsaturation from 0 to 3.

Vegetable oil triglycerides are defined by the typical percentages of the various fatty acids they contain. These percentages may vary with plant species and growing conditions. The vegetable oils useful in this invention include: soya, corn, sunflower, safflower, cotton seed, peanut, rape, crambe, jojoba, and lesquella seed oils.

By way of example only, a preferred oil, soya oil, has the following typical composition:

| Fatty Acid | Percentage |
|---|---|
| Myristic Acid | 0.1 |
| Palmitic Acid | 10.5 |
| Stearic Acid | 3.2 |
| oleic Acid | 22.3 |
| Linoleic Acid | 54.5 |
| Linolenic Acid | 8.3 |
| Arachidic Arid | 0.2 |
| Eicosenoic Acid | 0.9 |

A particular preferred composition may be derived from a blend of one or more vegetable oil sources.

Additives

Various additives can be included in relatively small amounts in the blends described above. These additives can be pour point depressants, antioxidants, and/or stabilizers. Preferred antioxidants include phenolic antioxidants, with di-tert-butyl paracreosol being a particularly preferred antioxidant, having the formula:.

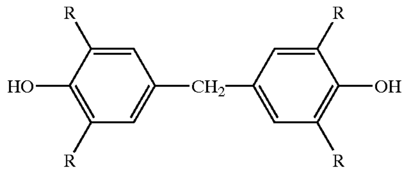

where R is $C(CH_3)_3$. Alternatively, a monoarylphenolic may be used, such as

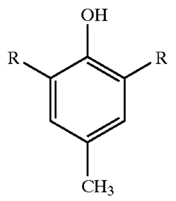

In addition, epoxide additives may be used to improve the stability and aging properties of the electrical system. An epoxide group has the following structure

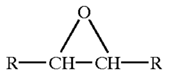

and examples of useful epoxides include

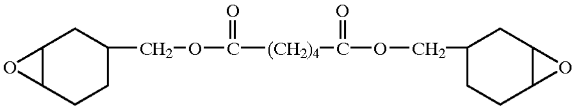

and

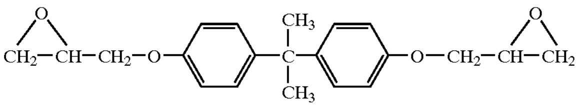

Additives that may be used to improve the low temperature properties of the insulating liquid by inhibiting crystallization of the fluid at low temperatures include oligomers and polymers of methylmethacrylate, oligomers and polymers of vinyl acetate, and oligomers and polymers of alkylated styrene, having the following formulas, respectively:

I

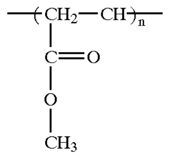

I

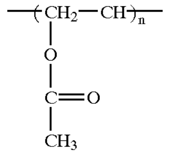

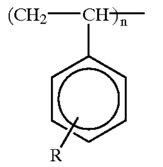

where R is a $C_6$ to $C_{20}$ branched or unbranched alkyl group.

As stated above, the dielectric fluids contemplated in the present invention consist of combinations of two or more of the classes of molecules previously described, including aromatic hydrocarbons, polyalphaolefins, polyolesters, and vegetable oils. For example, a preferred composition comprises about 75 to about 85 weight percent polyalphaoleftn combined with about 25 to about 15 weight percent of an aromatic molecule whose predominant composition is phenyl ortho xylyl ethane. Preferred polyalphaolefins include oligomers, and in particular a dimer, of 1-decene that have been hydrogenated to saturation. The preferred composition may also contain hindered phenolic antioxidants such as 2,6-di-tert-butylphenol, sold under the trade name Ethanox 701 by Albemarle, Inc. of Baton Rouge, La. Another additive that can be added to improve electrical stability is a diepoxide of which ERL 4299, manufactured by Union Carbide Corp. is a preferred example.

A polyalphaolefin may also be blended with a triaromatic as previously mentioned, wherein the aromatic contains three aromatic rings connected by means of a methylene or ethane bridge. Preferred aromatics include methyl substitution of the aromatic rings to increase compatibility with the polyalphaolefin component. The composition may range from about 1 to about 99 weight percent polyalphaolefin and from about 1 to about 99 weight percent triaromatic, with a more preferred range being from about 75 to about 85 weight percent polyalphaolefin and from about 25 to about 15 weight percent triaromatic. Additives may be added to improve stability and prevent oxidation as discussed above.

Similarly, a polyalphaolefin may be blended with polyol esters and/or triglycerides as previously mentioned. The composition may range from about 1 to about 99 weight percent polyalphaolefin and from about 1 to about 99 weight percent polyol ester and/or triglyceride, with a more preferred range being about 50±10 weight percent polyalphaolefin with about 50±10 weight percent weight percent polyol ester and/or triglyceride. Additives may be added to improve stability and prevent oxidation as discussed above. A preferred additive for use with polyol esters is 2,6-ditertiary butyl paracreosol (DBPC) at a level of 0.3 weight percent, and a preferred additive for use with vegetable oils is TBHQ at a level of 0.4 weight percent, The following Examples are intended to be illustrative only, and are not exhaustive of the types of oils contemplated by the present invention.

EXAMPLE I

A conventional 15 kVA transformer having a cylindrical enclosure and a headspace above a volume of conventional transformer oil comprising mineral oil was loaded to 80%, 100%, and 120% of capacity and the average winding temperature rise and the top oil temperature rise were measured under each condition. The results of these heat run measurements and the heat run measurements for the following Examples are tabulated in Table 1.

The same measurements were also made under each condition after a duct had been disposed about the core and coil assembly in the same conventional transformer (e.g., cylindrical enclosure, mineral oil under a headspace). The duct was added to reduce turbulence and provide a uniform laminar flow of dielectric fluid, and thereby also increase the rate of heat transfer. The duct employed in the test was not identical to the duct 120 described herein and, as explained above, the transformer employed in the test was likewise not constructed in accordance with the preferred embodiment described and depicted as transformer 10. Nevertheless, because the only difference between these series of tests was the addition of a duct, a comparison of the result shown in Tables 1 and 2 is considered a valid indictor of the benefits to be achieved by using a duct with the preferred dielectric fluid 40. The results of these measurements and the with-duct heat run measurements for the following Examples are tabulated in Table 2.

EXAMPLE II 65 weight percent of a polyalphaolefin having a viscosity of 10 cS was blended with 35 weight percent EXP-4, which is an aromatic fluid marketed by Elf-Atochem of Paris, France. The polyalphaolefin consisted of a blend of oligomers of decene. Its composition was: 0.1% dimer, 1.1% trimer, 42.5% tetramer, 32.3% pentamer, 11.8% hexamner and 12.2% heptamer. To the polyalphaolefin/ENP-4 blend was added 0.4 weight percent, based on the blend weight, of 4,4'-methylenebis(2,6-di-tert-butylphenol), an oxidation inhibitor sold under the trade name Ethanox 702 by Albemarle, Inc. of Baton Rouge, La. The additive-containing blend was placed in a conventional 15 kVA distribution transformer described above in Example I and subjected to the same loading conditions as in Example 1. The mixture of Example II was not tested with a duct before the results of the first, duct-less test indicated that this fluid was not preferred, as its heat run performance was inferior to those of the other fluids. Similarly, many of its properties were not measured for this reason.

EXAMPLE III 80 weight percent of a polyalphaolefin having a viscosity of 2 cS was blended with 20 weight percent of a butenylated biphenyl sold under the trade name SureSol 370 by Koch Chemical of Corpus Christi, Tex. The polyalphaolefin consisted of approximately 100% dister of decene. To the polyalphaolefin/SureSol blend was added 0.4 weight percent of an oxidation inhibitor such as 2,6-ditert-butylphenol, sold under the trade name Ethanox 701 by Albemarle, Inc. of Baton Rouge, La. The additive-containing blend was placed in the conventional 15 kVA distribution transformer described in Example 1 and subjected to the same loading conditions as in Example 1, both with and without a duct.

EXAMPLE IV

Example IV was identical to Example III, except that a decene polyalphaolefin having a viscosity of 4 cS was used. The composition of the polyalphaolefin was as follows: 0.6% dimer, 84.4% trimer, 14.5% tetramer, 0.5% pentamer.

EXAMPLE V

To the blend was added 0.4 weight percent of Ethanox 701. The additive-containing blend was placed in the conventional 15 kVA distribution transformer of Example I and subjected to the same loading conditions as in Example 1, both with and without a duct 120. As with the previous Examples, the results of these heat run measurements are tabulated in Tables 1 and 2.

In addition, some of the health and safety factors that are important in the selection of a dielectric coolant and their values for the compounds used in this example are listed in Table 5.

TABLE 1

(Without Duct)

| Loading Condition | Example I | Example II | Example III | Example IV | Example V |
|---|---|---|---|---|---|
| 80% Load | | | | | |
| avg. winding rise | 43.5 | 45.9 | 41.6 | 42.6 | 41.3 |
| top oil rise | 36.3 | 38.9 | 35.2 | 36.7 | 34.2 |
| 100% Load | | | | | |
| avg. winding rise | 63.2 | 61.5 | 57.2 | 58.6 | 59.0 |
| top oil rise | 50.8 | 51.3 | 47.8 | 49.6 | 48.1 |
| 120% Load | | | | | |
| avg. winding rise | 83.3 | 84.6 | 76.3 | 78.5 | 78.7 |
| top oil rise | 68.5 | 70.8 | 63.1 | 65.9 | 65.0 |

TABLE 2

(With Duct)

| Loading Condition | Example I | Example II | Example III | Example IV | Example V |
|---|---|---|---|---|---|
| 80% Load | | | | | |
| avg. winding rise | 43.2 | — | 39.6 | 41.2 | 40.9 |
| top oil rise | 37.3 | | 34.6 | 36.1 | 34.7 |
| 100% Load | | | | | |
| avg. winding rise | 59.6 | | 55.7 | 56.3 | 56.1 |
| top oil rise | 50.7 | | 47.8 | 48.9 | 47.5 |
| 120% Load | | | | | |
| avg. winding rise | 80.6 | — | 74.5 | 76.0 | 76.1 |
| top oil rise | 67.8 | | 64.4 | 65.4 | 64.3 |

Tables 3 and 4 list various properties of the fluids described in the preceding Examples.

TABLE 3

Physical Properties

| Physical Properties | Example I | Example II | Example III | Example IV | Example V |
|---|---|---|---|---|---|
| Flash Point (° C.) | 154 | 186 | 168 | 210 | 166 |
| Fire Point (° C.) | 164 | 204 | 177 | 229 | 178 |
| Pour Point (° C.) | −52 | −50 | −75 | −69 | <−74 |
| Viscosity | | | | | |
| @40° C. | 9.14 | x | 5.58 | 15.79 | 4.71 |
| @100° C. | 2.35 | x | 1.79 | 3.61 | 1.63 |
| Aniline Point (° C.) | 77 | x | 90.1 | 107 | 90.4 |
| Gassing Tendency (μL/min) | −7 | x | −21.5 | −36.4 | x |
| Density (g/ml) | 0.877 | 0.883 | 0.822 | 0.839 | 0.823 |
| Color | <0.5 | 0.5 | <0.5 | <0.5 | <0.5 |

TABLE 4

Electrical Properties

| Electrical Properties | Example I | Example II | Example III | Example IV | Example V |
|---|---|---|---|---|---|
| Dielectric Constant | 2.20 | x | 2.20 | 2.25 | 2.20 |
| Dissipation Factor | <0.0001 | <0.0001 | <0.0001 | <0.0001 | <0.0001 |
| Dielectric Strength (D-877) (kV) | 52 | x | 55.6 | 57.7 | 55 |
| Volume Resistivity (Ohm.cm) | 500 × 10E12 | x | 566 × 10E12 | 521 × 10E12 | 500 × 10E12 |
| Impulse Dielectric Strength (kV) | | | | | |
| >> Fluid | 172.3 | x | — | 145.3 | x |
| >> 10 mil. kraft paper w/fluid impregnate. (2" dia. electrodes) | 36.7 | x | 37.3 | 40.1 | x |

The following environmental data is available for the 2cS grade polyalphaolefin (PAO) and POXE fluids components.

Regulatory Information (PAO) - Sanctioned by the FDA under 21 CFR 178.3620(b). Has USDA HI authorization. (HI Lubricants with incidental contact with edible products.)
"Non-hazardous" per OSHA Hazard Communication standard 29 CFR 1910.1200.
"Not regulated for transportation" per DOT.
"In compliance" TSCA (15 USC 2601–2629)
"Not listed" (not regulated) per EPA SARA Title III Section 313.
CAS No. 68649116 (Albemarle)
(POXE) Fluid is not on the CERCLA (superfund hazardous) material list.
TSCA No. for similar molecule to POXE 6165-51-1.

Biodegradability (PAO) A "comparative biodegradability" experiment for the 2 cS grade PAO yielded 45% biodegradation by 2 weeks, 75% by 3 weeks, and 90% by 4 weeks. (CEC-L33 A-94) (Albemarle)
(POXE) 100% biodegradation within 7 days (Nippon)

Acute Toxicity - For LD50 testing of rats, the slightly toxic range is 0.5–5 g/kg, and the practically non-toxic range is 5–15 g/kg.

(PAO) LD50 in rats >5 g/kg (Albemarle)
EC50 bacteria (microtox test) - No toxic response for concentrations up to 4.95% in water. (Due to the low solubility of PAO's in water, they are generally not bioavailable to aquatic organisms. EC50 tests were conducted using the water soluble fraction of the PAO.) (Albermarle)
(POXE) LD50 in rats
1.7 g/kg (Nippon Oil)
2.3 g/kg (Koch Chemical)
2.3 ml/kg (Dielectrol III, Saperstein and Faeder article)

Note:

As a comparison, isopropyl alcohol (rubbing alcohol) has a listed value of 1.9 g/kg and common table salt has a value of 5.3 g/kg.

Chronic Toxicity (oral)

(POXE) In rats, 0.58 ml/kg/day for 1 month yielded 50% mortality. 0.146 ml/kg/day for 3–6 months showed lower weight gain, and liver/kidney enlargement (Dielectrol - Saperstein and Faeder.)
<146 mg/kg/day showed little to no effects. (Nippon Oil/Saperstein and Faeder)
(PAO) No data available to date.

According to the present invention, only those mixtures described above that have particular characteristics within preset ranges are suitable for use. Thus, only dielectric fluids having fire points at least about 145° C. (527° F.), viscosities no higher than 15 cS at 100° C., and pour points of less than −40° C. are selected. Furthermore, it is preferable to use fluids having fire points at least about 300° C. (572° F.), viscosities no higher than 12 cS at 100° C., and pour points of less than −50° C.

Although Example III appears to offer the best heat run measurements based on the results shown in Tables 1 and 2, the fluid of Example V is preferred for the present invention because of dielectric and environmental preference are completely biodegradable. The heat transfer properties of Example II are almost as good as those of Example III, and significantly more is known about the environmental, health and safety characteristics of the fluid of Example V. Furthermore, the most preferred embodiment consists of the composition described in Example V, with the modification that di-tertiary butyl paracreosol is substituted for the Ethanox 701.

In addition, long term thermal aging and compatibility testing was performed comparing conventional transformer (mineral) oil and the fluid from Example V with DBPC (di-tert-butyl paracreosol) as an additive. This was done by sealing standard transformer components in jars filled with the respective fluids. Independent systems were aged for 1000 hours at 130° C., 150° C., and 170° C. Fluid and component testing that followed the aging showed that the overall results were similar and that the tensile strength of standard insulating kraft paper was less degraded in the system containing the fluid from Example V for the 150° C. systems as compared with the conventional transformer oil as shown below. The dielectric and chemical properties of both fluids were retained similarly.

The results of a test in which kraft paper having a thickness of 0.010 inches was aged for 1000 hours in either mineral oil (Example I) or a fluid resembling that of Example V are as follows:

| Tensile Strength (p.s.i.) | | |
|---|---|---|
| Temperature | Mineral Oil | Example V (DBPC instead of Ethanox 701) |
| 130° C. | 17,200 | 16,800 |
| 150° C. | 14,000 | 14,300 |
| 170° C. | 5,400 | 5,000 |

In the above test, the experimental fluid comprised 80 weight percent of the same 2 cS polyalphaolefin used in Example III blended with 20 weight percent of a phenyl-ortho-tolyl-ethane sold under the trade name POXE by Koch Chemical of Corpus Christi, Tex., to which di-tertiary-butyl paracreosol (DBPC) was added instead of Ethanox 701. Other formulations of dielectric coolant that have been found to be useful include the formulations set out in Examples VI–IX.

EXAMPLE VI

Blends of 80 weight percent pentaerythritol esters wherein the alkyl group is $C_9$ with 20 weight percent phenyl ortho xylyl ethane.

EXAMPLE VII

Blends of 80 weight percent soya oil triglycerides with 20 weight percent phenyl ortho xylyl ethane.

EXAMPLE VIII

Blends of 70 weight percent of a 2 cS polyalphaolefin with 15 weight percent pentaerythritol esters wherein the alkyl group is $C_9$ and 15 weight percent phenyl ortho xylyl ethane.

EXAMPLE IX

Blends of 70 weight percent of a 2 cS polyalphaolefin with 15 weight percent soya oil triglycerides and 15 weight percent phenyl ortho xylyl ethane.

According to the present invention, useful compositions may be derived by the combination of aromatic hydrocarbons with PAO's, polyol esters with PAO's, vegetable oils with PAO's, aromatics with polyol esters or vegetable oils, and combinations of aromatics, PAO's and either a polyol ester or a vegetable oil.

It is understood that additives such as those previously mentioned in foregoing compositions may also be required to optimize the performance of these compositions for their intended electrical application.

Fluid Processing and Filling System 150

As described previously, dielectric fluid 40 has a defined chemical composition and contains at least two compounds. The present invention provides novel methods and apparatus for processing the fluid from such constituent compounds and for filling transformer 10 once the fluid 40 has been prepared. The presently-preferred method for processing the fluid 40 will be described in the following description with reference to two compounds (for brevity, referred to as compounds "A" and "B").

Figure 8A:
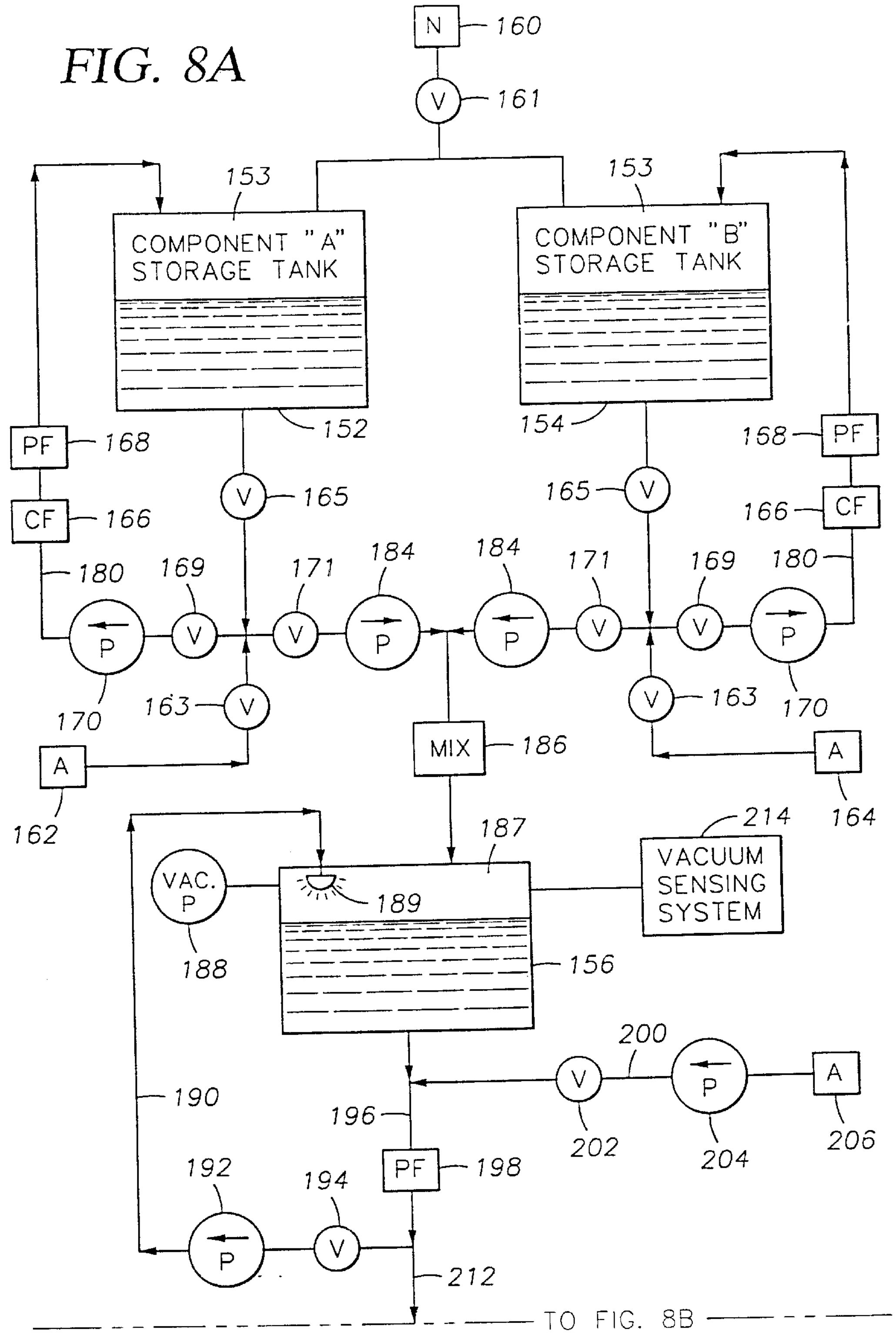
FIGS. 8A and 8B comprise a flow diagram showing in schematic form the processing system for preparing the dielectric fluid and for drying, filling, and sealing the transformer of FIG. 1.
Figure 8B:
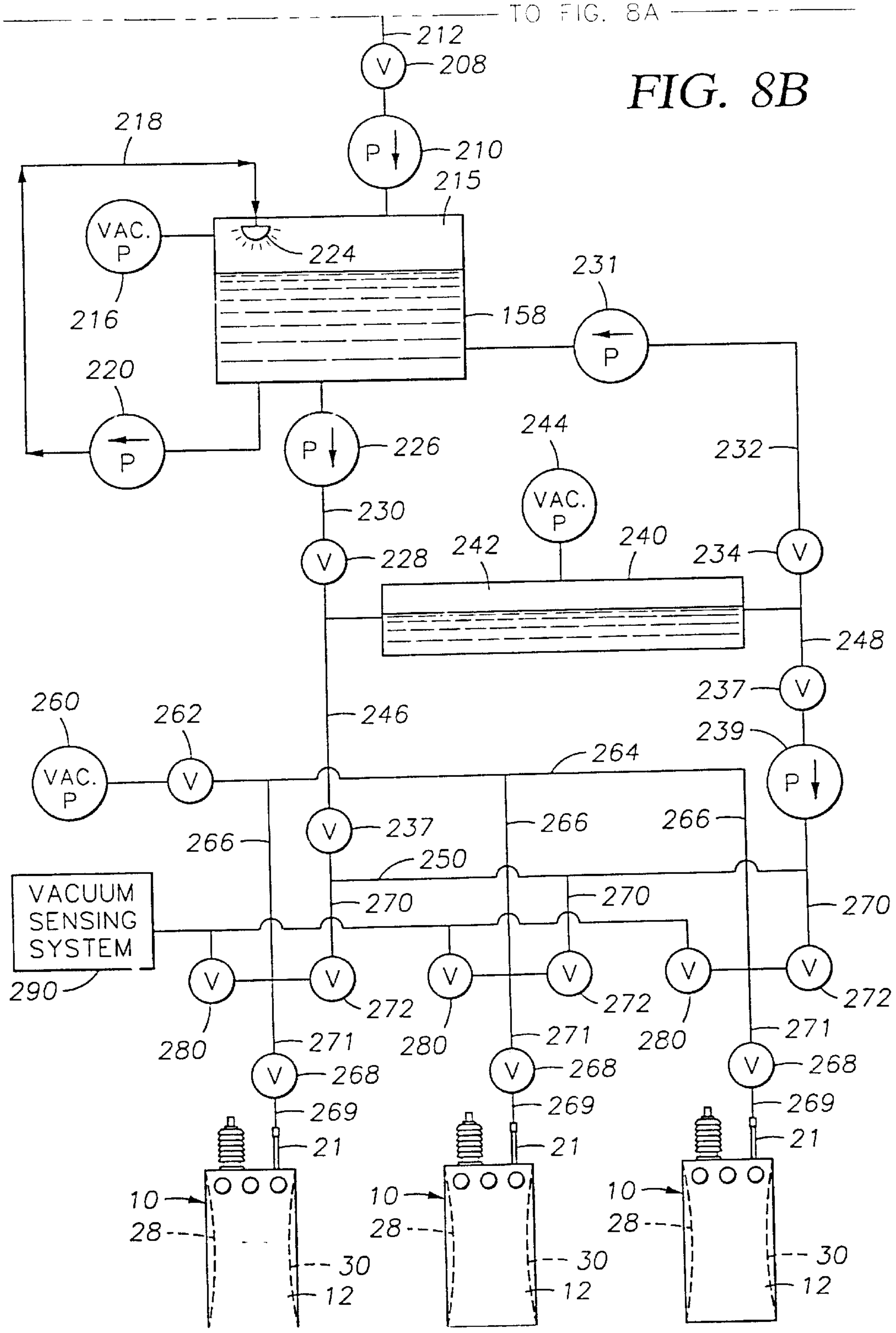

Referring to FIGS. 8A and 8B, fluid processing and filling system 150 is described and shown generally to comprise compound "A" storage tank 152, compound "B" storage tank 154, fluid processing tank 156, and processed-fluid storage tank 158. Compound A is pumped from drum or isotanker 162 into component "A" storage tank 152 by pump 170 through valves 163 and 169 (valves 165 and 171 being closed) and through clay filter 166 and particle filter 168 in line 180.

Similarly, compound "B" is pumped from drum or isotanker 164 through filters 166, 168 in line 180 and into compound "B" storage tank 154. Filters 166, 168 remove the undesirable ionic and particulate contaminants. A nitrogen head space 153 is maintained in tanks 152, 154 by means of nitrogen source 160 and valve 161. Once the fluid levels in storage tanks A and B have reached a predetermined level, valves 163 are closed and valves 165 are opened. Pumps 170 then operate to continuously circulate the fluids stored in tanks 152, 154 through lines 180 and filters 166, 168. As will be understood by those skilled in the art, for fluids 40 that are comprised of more than two compounds, additional storage tanks, supply lines, filters and pumps identical to those previously described will be employed and interconnected to common feed line 182.

It is presently preferred that fluid 40 be processed on a batch basis. Accordingly, when a volume of fluid 40 is to be prepared, valves 169 are closed and valves 171 are opened (valves 165 remaining open). Pumps 184 independently meter the compounds A and B from tanks 152, 154 at predetermined rates so that the fluid entering mixing chamber 186 has a desired composition. Pump 184 may be, for example, model/part number M3560 made by Baldor Company.

The fluid mixture flows through feed line 182 and valve 183 into mixing chamber 186 that contains baffles (not shown) to promote the mixing of compounds A and B prior to their entering processing tank 156. The solution of partially-mixed compounds A and B flows into processing tank 156 from mixing chamber 186. As tank 156 is never completely filled, a headspace 187 is maintained in tank 156. Headspace 187 is under vacuum as controlled by vacuum pump 188. The fluid mixture in processing tank 156 is degassed to remove air and other gasses from the fluids which otherwise might detrimentally affect the transformer's ability to dissipate heat to the extent required. The fluid 40 within the processing tank is agitated by circulating the liquid through line 190 and valve 194 by means of pump 192. The circulating mixture exits tank 156 through line 196 and passes through particle filter 198 which removes contaminants from the mixture. The circulation agitates the liquid so as to allow it to be more effectively degassed through operation of the vacuum pump 188, which develops a vacuum in headspace 187 of less than 500 microns of mercury, and preferably less than 100 microns of mercury. To enhance the degassing, the liquid is preferably returned to tank 156 through a spray nozzle 189, which is fed by line 190 and is located above the liquid level in processing tank 156. Alternatively, or in addition to providing spray nozzle 189, the fluid returning to tank 157 through line 190 may be passed over baffles in the tank (not shown) to promote efficient degassing and drying. In addition, an additive stream can be added to the circulating liquid by means of additive reservoir 206, additive pump 204, and valve 202.

Circulation of the fluid mixture 40 in processing tank 156 will continue until an acceptable vacuum level and moisture content of the fluid is obtained. The vacuum is measured by vacuum sensing system 214 connected to headspace 187. The vacuum sensing unit is a standard unit in which the absolute pressure or vacuum in headspace 187 can be indicated on a LED display or other visual indicator. One such sensor suitable for the present application is Model No. VT-652 manufactured by Teledyne Hastings-Raydist. The moisture content of the fluid is determined by means of Karl-Fischer titration. Apparatus capable of measuring the moisture content in the present application is a moisture meter made by Mitsubishi Chemical Industries model number CA-05. The fluid moisture content is preferably less than 10 ppm. Additive concentration level is checked by gas chromatography or color-indicator titration. After the fluid 40 has been processed to acceptable parameters, valve 194 is closed, valve 208 is opened, and the fluid 40 is pumped to fluid storage tank 158 through line 212 by pump 210.

When fluid 40 has been dried and degassed to acceptable levels, the batch of fluid 40 is pumped to storage tank 158. Because the process in tank 156 is a batch process, while the rate of fluid used to fill transformers is independent of that process, the volume of fluid in storage tank 158 fluctuates leaving a headspace 215. In order to ensure a supply of substantially gas-free and moisture-free fluid 40, headspace 215 is under vacuum supplied by a vacuum pump 216. The dielectric fluid 40 in storage tank 158 is maintained under vacuum in a manner similar to that described with reference to processing tank 156. Specifically, vacuum pump 216 connected to the headspace 215 draws a vacuum in the range of less than 500 microns or mercury, and preferably less than 100 microns. The liquid within the tank is agitated by continuously circulating the liquid through a closed line 218 by pump 220. Spray nozzle 224 is preferably connected to line 218 to spray the returning liquid in the headspace 215. This second degassing process is to assure a supply of gas free and moisture free fluid.

Before transformers 10 are filled with dielectric fluid 40 from tank 158, the transformers are first dried in a conventional manner by short circuit heating. Transformers 10 are not connected to filling system 150 during this process. This initial drying process typically requires several hours and preferably is performed prior to or while dielectric fluid 40 is being processed.

In carrying out the batch filling process of the transformers, a series of assembled transformers 10 that have undergone the initial drying process described above are placed on a supporting surface. These transformers are completely assembled in accordance with the description provided above, the only steps remaining before completion of the units being the evacuation and subsequent filling of enclosure 12 with dielectric fluid 40 and the sealing of fill tube 21.

To evacuate and fill transformer enclosure 12, fill tube 21 of each transformer 10 is connected to its respective fill line 269 by a standard quick-release coupling 25 (FIG. 7). Fill lines 269 are interconnected with dry header 264 by lines 266 and valves 268. Dry header 264 is connected to vacuum pump 260 through valve 262. Valves 262 and 268 are then opened and vacuum pump 260 actuated to draw a vacuum on the interior of each transformer enclosure 12 while valves 272 are all closed. The vacuum in enclosure 12 will preferably be less than 500 microns and most preferably less than 100 microns. During this stage of the process, valves 280 are opened to permit vacuum sensing unit 290 to sense and indicate the magnitude of the vacuum in each enclosure 12. Vacuum sensing system 290 may be identical to vacuum sensing unit 214 previously described. The desired vacuum can be accomplished in a matter of approximately 16 hours, during which time the temperature of the transformer enclosure is maintained below 60° C., and preferably at room temperature. During this evacuation and drying process, transformer enclosures 12 that leak and thus are unable to maintain the desired vacuum level may be identified by means of isolation and vacuum decay check and removed from the filling process for repair.

When the predetermined time and vacuum level is reached, valves 280 and 262 are closed so as to isolate the enclosures 12 from dry header 264. The volume of fluid 40 required to fill the enclosures 12 is then pumped from fluid storage tank 158 by pump 226 through valve 228 to large wet header 240. Wet header 240 includes a head space 242 maintained by vacuum pump 244 under a vacuum substantially equal to that provided in transformer enclosures 12. With valves 228, 234 and 272 closed and valves 236 and 237 opened, this measured volume of fluid 40 is circulated through the small wet header 250 by a circulating pump 239 and back to large wet header 240 through lines 246 and 248 to ensure that all bubbles are removed from small wet header 250 before transformer enclosures 12 are filled. Once this is accomplished as determined by means of proper vacuum measurement, valves 268 and 272 will be opened and fluid 40 will be permitted to drain into enclosures 12 from small wet header 250 through lines 270, 271 and lines 269. Transformer 10, having a 15 kVA rating and an enclosure with the dimensions previously described, will require less than four and one-half gallons to surround core and coil assembly 11 and completely fill enclosure 12. With enclosure 12 housing core and coil assembly 11 and completely filled with 4.3 gallons of fluid 40, the ratio of enclosure surface area to volume of fluid in chamber 13 is approximately 200 square inches per gallon.

In the event that it is desired to return fluid from large wet header 240 to storage tank 158, line 232, valve 234 and pump 233 are provided.

As thus described, transformers 10 will be filled while each enclosure 12 is maintained at a less than atmospheric pressure, one in the range of about one to seven p.s.i. below atmospheric pressure and, most preferably within the range of about one to three p.s.i. below atmospheric pressure. After being filled, the fill tube 21 is hermetically sealed by first crimping the tube a few inches above cover 34 and then by soldering over the crimped portion. In this manner, there will be provided a completely and permanently hermetically sealed transformer 10 wherein the entire interior of the transformer completely filled with a dry, degassed dielectric cooling fluid 40 at an absolute pressure less than one atmosphere.

Transformer Operation

It is desirable to provide for expansion and contraction of the dielectric fluid 40 during operation of transformer 10. Accordingly, walls 24, 26, 28, 30, 32 and 34 are made of relatively thin steel which will allow them to flex, bow or bulge (within the elastic limits of the metal) as the fluid undergoes expansion and contraction. In this regard, chamber 13 of enclosure 12 may be described as having a dynamic or nonstatic volume, a volume that changes as the fluid expands and contracts. Depending on the temperature of fluid 40, the volume of chamber 13 may increase approximately 10–15% from the volume the chamber possesses when it is initially filled and sealed.

Figure 12:
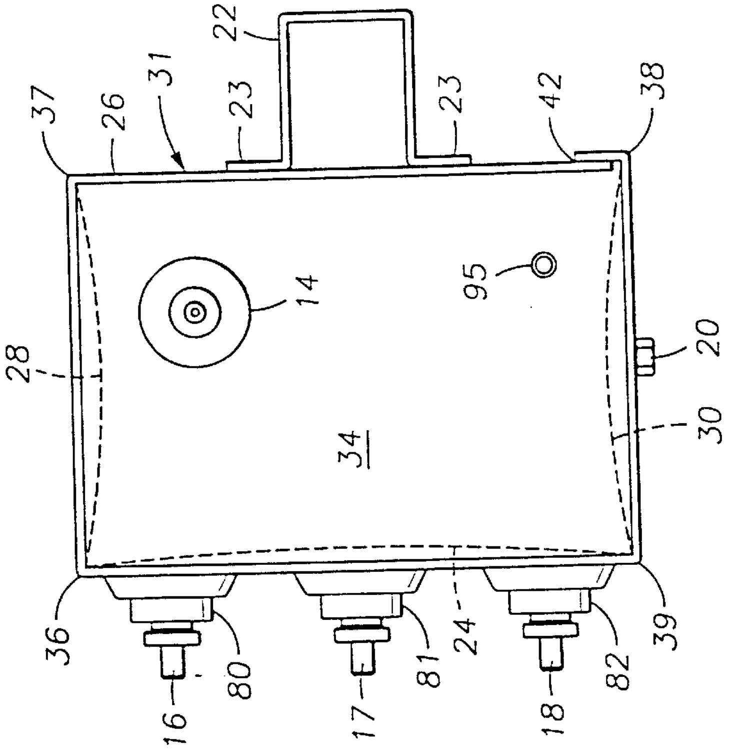
FIG. 12 is a top plan view of the transformer of FIG. 1 shown after the enclosure has been filled with dielectric fluid and sealed.

As described above, the transformer 10 is initially filled with dielectric fluid 40 at an absolute pressure under one atmosphere which will cause the walls 24, 26, 28, 30, 32 and 34 to flex or bow inwardly in varying measures from their unflexed and substantially planar configurations possessed by these surfaces prior to the enclosure 12 being sealed (such unflexed, substantially planar configurations best shown in FIG. 3). The inwardly flexed or bowed, nonplaner configuration is best shown in FIGS. 8 and 12. In the preferred embodiment described herein, side walls 28, 30 will flex or bow more than the other walls of enclosure 12. This is because side walls 28, 30 have relatively large unsupported spans of sheet steel (as compared to the sizes of bottom wall 32 and cover 34) and because such spans are not reinforced by thicker steel, gussets, ribs or other reinforcements (as may be provided on cover 34 and front wall 24 in some transformers to prevent excessive flexure adjacent to the sealed apertures 48, 49 that are provided for bushings 14, 16–18). The attachment of hanger 22 on rear wall 26 will partially limit the degree to which rear wall 26 will bow, bulge or flex. As shown in FIG. 12, inwardly bowed sides 28 and 30 have the greatest deflection at a location substantially halfway between the edges of the sides. This is because the strength and rigidity supplied by the comers 36–39 decreases upon moving away from the comers. Likewise, as shown in FIG. 8, the greatest inward deflection of sides 28, 30 occurs at the location approximately half way between bottom wall 32 and cover 34. Again, the corners formed by the intersection of sides 28, 30 with cover 34 and bottom wall 32 provide rigidity and resist deflection. As will be understood by referring to FIGS. 8 and 12, the inwardly flexed walls are bowed in two dimensions and thus are described as being concave.

Figure 13:
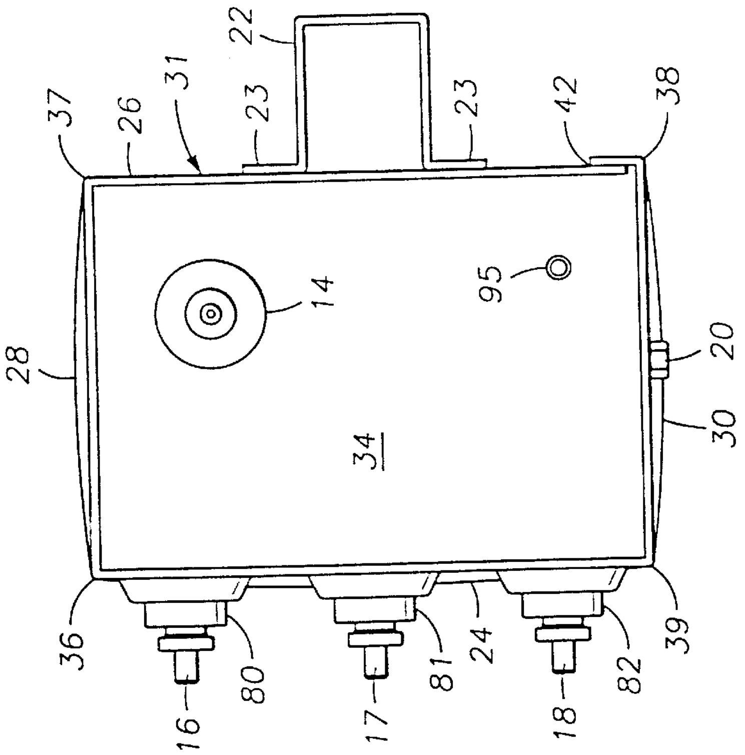
FIG. 13 is a view similar to FIG. 12 showing the transformer of FIG. 1 after the dielectric fluid has undergone thermal expansion.

Upon installation and energization of transformer 10, the dielectric fluid 40 will be heated and will expand. When a substantial amount of thermal expansion has occurred, walls 28, 30 (and walls 24, 26, 32 and cover 34 to lesser degrees) will flex or bow outwardly from their initial inwardly-bowed positions and, depending upon the temperature rise, may assume a bulging configuration as shown in FIG. 13 in which they are bowed or flexed outwardly relative to the internal core and coil assembly 11 and relative to an unflexed configuration of the walls (FIG. 3). It is preferred that flexure of walls 24, 26, 28, 30, 32 and 34 be permitted to allow an expansion of chamber 13 to a volume that is at least 10% greater than the volume possessed by chamber 13 when it was initially filled. Thus, the thermal expansion of dielectric coolant 40 may be permitted by allowing the walls of enclosure 12 to flex or bow outwardly. Thus, the present invention accounts for and permits for thermal expansion of dielectric fluid 40 without the inclusion of any air space or air pockets within the transformer or any venting means or other pressure relief devices.

While preferred embodiments of the invention have been shown and described, modifications thereof can be made by one skilled in the art without departing from the spirit and teachings of the invention. The embodiments described herein are exemplary only, and are not limiting. Many variations and modifications of the invention and apparatus disclosed herein are possible and are within the scope of the invention. Accordingly, the scope of protection is not limited by the description set out above, but is only limited by the claims which follow, that scope including all equivalents of the subject matter of the claims.

What is claimed is:

1. An electrical apparatus comprising:

a chamber;

a conductor in the chamber; and a dielectric coolant surrounding the conductor, wherein the dielectric coolant consists essentially of:

about 1 to about 99 weight percent alphaolefin oligomers with carbon chain lengths of C6 to C12 and, about 1 to about 99 weight percent of a compound selected from the group consisting of:

(a) polyols esterified with linear or branched alkyl groups with chain lengths of C5 to C20, and (b) triglycerides.

2. An electrical apparatus comprising:

an enclosure;

a core and coil assembly in the enclosure; and a dielectric coolant surrounding the core and coil assembly, wherein the coolant consists essentially of a polyalphaolefin and a polyol ester, said polyalphaolefin being selected from the group consisting of oligomers of C6, C8, C10 and C12 alphaolefins.

3. The electrical apparatus according to claim 1, wherein said polyol ester is selected from the group consisting of neopentyl glycol, trimethylolpropane, and pentaerithritol.

4. The method according to claim 1, wherein said triglyceride comprises a naturally occurring vegetable oil.

5. The method according to claim 1, wherein the mixture further comprises at least one of an antioxidant and a pour point depressant.

6. A method of making a transformer comprising a chamber enclosing a core and coil assembly, the method comprising filling the chamber with a dielectric coolant comprising a mixture of:

a polyalphaolefin; and one of a polyol ester and a triglyceride.

7. A method of filling a transformer with a coolant, wherein the transformer comprises a chamber enclosing a core and coil assembly, the method comprising:

drying the chamber; and filling the chamber with a dielectric coolant fluid comprising a mixture of:

a polyalphaolefin; and one of a polyol ester and a triglyceride.

8. The electrical apparatus according to claim 2, wherein the coolant consists essentially of:

about 1 to about 99 weight percent of a polyalphaolefin with a viscosity of about 2 cS at 100° C., about 1 to about 99 weight percent of said polyol ester, and about 0 to about 1 weight percent of an antioxidant.

9. The electrical apparatus according to claim 2, wherein the coolant consists essentially of:

about 45 to about 55 weight percent of a polyalphaolefin with a viscosity of about 2 cS at 100° C., about 55 to about 45 weight percent of said polyol ester, and about 0.3 weight percent of an antioxidant.

10. The electrical apparatus according to claim 2, wherein the coolant further comprises a diepoxide.

11. The electrical apparatus according to claim 2, wherein the coolant further comprises an antioxidant.

12. The electrical apparatus according to claim 4, wherein said polyol ester comprises an alkyl group having a chain length from C8 to C10.

13. The electrical apparatus according to claim 2, wherein the coolant further comprises a pour point depressant.

14. The electrical apparatus according to claim 6, wherein the branching location is at an alpha position of said alkyl group.

15. An electrical apparatus comprising:

a chamber;

a conductor in the chamber; and a dielectric coolant surrounding the conductor, wherein the coolant consists essentially of a polyalphaolefin with a triglyceride, said polyalphaolefin being selected from the group consisting of oligomers of C6, C8, C10 and C12 alphaolefins.

16. The electrical apparatus according to claim 2, wherein the mixture comprises:

about 45 to about 55 weight percent of a polyalphaolefin with a viscosity of about 2 cS at 100° C., about 55 to about 45 weight percent of said polyol ester, and about 0.3 weight percent of an antioxidant.

17. The electrical apparatus according to claim 2, further comprising a diepoxide.

18. The electrical apparatus according to claim 2, further comprising an antioxidant.

19. The electrical apparatus according to claim 15, wherein the coolant further comprises an antioxidant.

20. The electrical apparatus according to claim 2, further comprising a pour point depressant.

21. The electrical apparatus according to claim 13, wherein the pour point depressant is polymethacrylate.

22. An electrical apparatus comprising:

a chamber;

a conductor in the chamber; and a dielectric coolant surrounding the conductor, wherein the coolant comprises a mixture of a polyalphaolefin with a triglyceride, said polyalphaolefin being selected from the group consisting of oligomers of C6, C8, C10 and C12 alphaolefins.

23. An electrical apparatus comprising:

a chamber;

a conductor in the chamber; and a dielectric coolant surrounding the conductor, wherein the dielectric coolant consists essentially of:

about 1 to about 60 weight percent alphaolefin oligomers with carbon chain lengths of C6 to C12 and about 40 to about 99 weight percent of a compound selected from the group consisting of:

(a) polyols esterified with linear or branched alkyl groups with chain lengths of C5 to C20, and (b) triglycerides.

24. A method of cooling a transformer with a core and coil assembly, comprising surrounding the core and coil assembly with a fluid consisting essentially of:

a polyalphaolefin; and one of a polyol ester and a triglyceride.

25. The electrical apparatus according to claim 15, wherein said triglyceride is selected from the group consisting of soya oil, sunflower oil, rapeseed oil, cottonseed oil, corn oil, olive oil, safflower oil, jojoba oil, lesquerella oil and combinations thereof.

26. The electrical apparatus according to claim 15, further comprising an antioxidant.

27. The electrical apparatus according to claim 19, wherein the antioxidant is selected from the group consisting of TBHQ, BHA, BHT and DBPC.

28. The method according to claim 24, wherein the fluid further comprises at least one of an antioxidant and a pour point depressant.

29. A method of making a transformer comprising a chamber enclosing a core and coil assembly, the method comprising filling the chamber with a dielectric coolant consisting essentially of:

a polyalphaolefin; and one of a polyol ester and a triglyceride.

30. A method of filling a transformer with a coolant, wherein the transformer comprises a chamber enclosing a core and coil assembly, the method comprising:

drying the chamber; and filling the chamber with a dielectric coolant consisting essentially of:

a polyalphaolefin; and one of a polyol ester and a triglyceride.

* * * * *

UNITED STATES PATENT AND TRADEMARK OFFICE

CERTIFICATE OF CORRECTION

PATENT NO. : 6,485,659 B1
DATED : November 26, 2002
INVENTOR(S) : Gary L. Goedde et al.

It is certified that error appears in the above-identified patent and that said Letters Patent is hereby corrected as shown below:

Column 33,
Line 34, please insert a semicolon after "C12".
Line 52, please delete "method" and insert -- electrical apparatus -- therefor.
Lines 52-53, please delete "triglyceride" and insert -- polyol ester -- therefor.
Line 53, please delete "a naturally occurring vegetable oil" and insert -- an alkyl group having a chain length of C5 to C20 -- therefor.
Line 54, please delete "method" and insert -- electrical apparatus -- therefor.
Line 54, please delete "1" and insert -- 4 -- therefor.
Lines 54-56, please delete "the mixture further comprises at least one of an antioxidant and a pour point depressant" and insert -- said polyol ester comprises an alkyl group having a chain length from C8 to C10 -- therefor.
Please delete claim 6 in its entirety and insert substitute claim 6 -- The electrical apparatus according to claim 4, wherein said alkyl group is branched -- therefor.
Please delete claim 7 in its entirety and insert substitute claim 7 -- The electrical apparatus according to claim 6, wherein the branching location is at an alpha position of said alkyl group -- therefor.

Column 34,
Please delete claim 11 in its entirety.
Line 25, please delete "4" and insert -- 9 -- therefor.
Lines 26-27, please delete "said polyol ester comprises an alkyl group having a chain length from C8 to C10" and insert -- the antioxidant is selected from the group consisting of TBHQ, BHA, BHT, and DBPC -- therefor.
Line 30, please delete "6" and insert -- 13 -- therefor.
Lines 31-32, please delete "the branching location is at an alpha position of said alkyl group" and insert -- the pour point depressant is polymethacrylate -- therefor.
Line 41, please delete "2" and insert -- 15 -- therefor.
Lines 42-48, please delete "the mixture comprises: about 45 to about 55 weight percent of a polyalphaolefin with a viscosity of about 2 cS at 100° C., about 55 to about 45 weight percent of said polyol ester, and about 0.3 weight percent of an antioxidant" and insert -- said triglyceride comprises three fatty acid chains, each of said fatty acid chains having a chain length of C4 to C22 -- therefor.
Line 49, please delete "2" and insert -- 15 -- therefor.

UNITED STATES PATENT AND TRADEMARK OFFICE
CERTIFICATE OF CORRECTION

PATENT NO. : 6,485,659 B1
DATED : November 26, 2002
INVENTOR(S) : Gary L. Goedde et al.

It is certified that error appears in the above-identified patent and that said Letters Patent is hereby corrected as shown below:

Column 34 cont'd,
Lines 49-50, please delete "further comprising a diepoxide" and insert -- wherein said triglyceride comprises a naturally occurring vegetable oil -- therefor.
Line 51, please delete "2" and insert -- 15 -- therefor.
Lines 51-52, please delete "further comprising an antioxidant" and insert -- wherein said triglyceride is selected from the group consisting of soya oil, sunflower oil, rapeseed oil, cottonseed oil, corn oil, olive oil, safflower oil, jojoba oil, lesquerella oil and combinations thereof -- therefor.
Line 55, please delete "2" and insert -- 19 -- therefor.
Lines 55-56, please delete "further comprising a pour point depressant" and insert -- wherein the antioxidant is selected from the group consisting of TBHQ, BHA, BHT, and DBPC -- therefor.
Line 57, please delete "13" and insert -- 15 -- therefor.
Line 58, please delete "wherein the" and insert -- further comprising a -- therefor.
Line 58, please delete "is polymethacrylate".
Please delete claim 22 in its entirety and insert substitute claim 22 -- The electrical apparatus according to claim 20, wherein the pour point depressant is polymethacrylate -- therefor.

Column 35,
Line 18, please delete "electrical apparatus" and insert -- method -- therefor.
Line 18, please delete "15" and insert -- 24 -- therefor.
Lines 19-22, please delete "wherein said triglyceride is selected from the group consisting of soya oil, sunflower oil, rapeseed oil, cottonseed oil, corn oil, olive oil, safflower oil, jojoba oil, lesquerella oil and combinations thereof"and insert -- wherein the polyalphaolefin is selected from the group consisting of oligomers of C6, C8, C10 and C12 alphaolefins -- therefor.
Line 23, please delete "electrical apparatus" and insert -- method -- therefor.
Line 23, please delete "15" and insert -- 24 -- therefor.
Lines 23-24, please delete "further comprising an antioxidant" and insert -- wherein said triglyceride comprises three fatty acid chains, each of said fatty acid chains having a chain length of C4 to C22 -- therefor.

UNITED STATES PATENT AND TRADEMARK OFFICE

CERTIFICATE OF CORRECTION

PATENT NO. : 6,485,659 B1
DATED : November 26, 2002
INVENTOR(S) : Gary L. Goedde et al.

It is certified that error appears in the above-identified patent and that said Letters Patent is hereby corrected as shown below:

Column 36,
Line 1, please delete "electrical apparatus" and insert -- method -- therefor.
Line 1, please delete "19" and insert -- 24 -- therefor,
Lines 2-3, please delete "wherein the antioxidant is selected from the group consisting of TBHQ, BHA, BHT, and DBPC" and insert -- wherein said triglyceride comprises a naturally occurring vegetable oil -- therefor.

Signed and Sealed this

Seventeenth Day of February, 2004

JON W. DUDAS
*Acting Director of the United States Patent and Trademark Office*